(12) United States Patent
Cideciyan et al.

(10) Patent No.: US 6,557,124 B1
(45) Date of Patent: Apr. 29, 2003

(54) METHOD AND SYSTEM FOR ENCODING DATA FOR HIGH PERFORMANCE ERROR CONTROL

(75) Inventors: Roy D. Cideciyan, Rueschlikon (CH); Jonathan D. Coker, Rochester, MN (US); Evangelos S. Eleftheriou, Zurich (CH); Richard L. Galbraith, Rochester, MN (US); Todd C. Truax, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 416 days.

(21) Appl. No.: 09/613,443

(22) Filed: Jul. 11, 2000

(30) Foreign Application Priority Data

Jul. 12, 1999 (EP) .............................................. 99113399

(51) Int. Cl.⁷ ........................... G06F 11/00; G06F 11/30
(52) U.S. Cl. ....................................... 714/701; 714/746
(58) Field of Search ................................ 714/701, 746, 714/752; 341/58, 59, 68, 81

(56) References Cited

U.S. PATENT DOCUMENTS

| | | | |
|---|---|---|---|
| 5,748,119 A | * 5/1998 | Ko | 341/59 |
| 5,859,601 A | 1/1999 | Moon et al. | |
| 5,968,199 A | 10/1999 | Khayrallah et al. | |
| 6,003,153 A | 12/1999 | Shimoda | |
| 6,097,320 A | * 8/2000 | Kuki et al. | 341/58 |
| 6,241,778 B1 | * 6/2001 | de Lind van Wijngaarden et al. | 341/58 |
| 6,373,407 B1 | * 4/2002 | Nishiya et al. | 341/59 |

FOREIGN PATENT DOCUMENTS

| | | | |
|---|---|---|---|
| EP | 0097763 A2 | * | 1/1984 |
| EP | 0597443 A1 | * | 5/1994 |
| GB | 2315650 A | * | 2/1998 |

* cited by examiner

Primary Examiner—Christine T. Tu
(74) Attorney, Agent, or Firm—G. Marlin Knight; Bracewell & Patterson, L.L.P.

(57) ABSTRACT

A method and apparatus for encoding a plurality of successive m-bit binary data words to produce a plurality of successive of n-bit binary code words, where n and m are positive integers and n is greater than m, for supply to a magnetic recording channel. Each m-bit binary data word is partitioned into a plurality of blocks of bits, and at least one said blocks of bits in each m-bit binary data word is encoded in accordance with a finite-state coding scheme to produce a plurality of successive n-bit binary code words. At least one stage of violation correction which transforms the plurality of successive n-bit binary code words. Violation correction includes detecting the occurrence of any of a plurality of prohibited bit patterns at one or more predetermined locations within each n-bit binary coded word, and replacing any prohibited bit pattern so detected by a corresponding substitute bit pattern. The finite-state coding scheme, the prohibited bit patterns, and corresponding substitute bit patterns are predetermined such that in a serial bit-steam comprising the successive n-bit binary code words, the maximum number of consecutive bits of a first value is limited to a first predetermined number j, where b greater or equal to 2, and the maximum number of consecutive bits of the a second value is limited to a second predetermined number k.

18 Claims, 4 Drawing Sheets

METHOD AND SYSTEM FOR ENCODING DATA FOR HIGH PERFORMANCE ERROR CONTROL

BACKGROUND OF THE INVENTION

1. Technical Field

This invention relates generally to data encoding systems, and more particularly to systems implementing codes of the type known as maximum transition run (MTR) codes.

2. Description of the Related Art

Channel codes are mappings of data bits into symbols (i.e. channel bits) which are recorded on to a medium in a storage device, such as a computer hard disk drive. Channel codes are commonly used to prevent certain characteristics in the bit-stream of symbols that make recovery of the data bits more difficult. The code rate for such a code is usually specified as m/n, which indicates the ratio of the number of data bits "m" to channel bits "n". MTR codes are a particular type of channel code utilized to eliminate certain error prone binary patterns from the allowable set of channel bits recorded on a magnetic recording medium, such as a magnetic disk or tape. With MTR codes, the number of consecutive transitions that can occur in the magnetization pattern on the recording medium is limited to a particular number denoted by "j". When used in conjunction with the NRZI (Non-Return-to-Zero-Inversion) recording format, a MTR code limits the maximum number of consecutive "1's" in the channel bit-sequence. This j constraint produces the desirable consequence of reducing errors in data recovery. More particularly, the bit-error .rate performance is improved by providing a distance gain (i.e. an increase in the minimum Euclidean distance between recording patterns), or by eliminating the most likely error events, thus reducing the likelihood of .errors in the sequence detectors on the data recovery side. For example, when used in conjunction with higher-order partial response shaping and maximum likelihood sequence detection, such as in an E2PR4 partial response channel, MTR codes with j=2 can deliver a distance gain of 2.2 dB. MTR codes with j=2 also allow data to be written to a disk at very high rates. The design of high code-rate MTR codes is therefore of great interest, and particularly so for the higher-order partial response channels used in hard disks for example.

In addition to the j constraint, MTR codes typically limit the maximum number of consecutive "0's" to a particular number denoted as "k" to aid timing recovery and gain control, and such a code is usually specified as an MTR(j, k) code. MTR(j, k) codes with j=2 are discussed in U.S. Pat. No. 5,859,601. A rate 6/7 MTR(2, 8) code is proposed in IEEE Transactions on Magnetics, Vol. 33, No. 5, September 1997, "Design of a Rate 6/7 Maximum Transition Run Code", Brickner and Moon. It can be shown that this code is quasi-catastrophic and requires very long path memories in the sequence detector. Quasi-catastrophic codes include coded bit-sequences containing a succession of the bit series 1100, which are undesirable because these bit-sequences do not accumulate Euclidean distance in the sequence detector and the coded bit-sequence is therefore more likely to be identified incorrectly. Quasi-catastrophic error events are avoided in a rate 16/17 MTR code with j=3 which is discussed in a paper by Takushi et al, Hitachi Ltd, published at the GLOBECOM'98 conference in November 1998 under the title "Turbo-EEPRML: An EEPR4 Channel with an Error-Correcting Post-Processor Designed for 16/17 Rate Quasi-MTR code". A rate 16/19 MTR(2, 7) code is also mentioned in IEEE Transactions on Magnetics, Vol. 32, No. 5, September 1996, "Maximum Transition Run Codes for Data Storage Systems", Brickner and Moon, though the question of implementing such a code without resorting to a costly lookup table has not been addressed.

SUMMARY OF THE INVENTION

The methods of the present invention provide for MTR codes to be implemented by partitioning the input data words into blocks of bits and then applying coding and a violation correction stage in such a manner as to satisfy the j, k constraints. This partitioned-block implementation provides the advantages of MTR codes while dramatically simplifying the implementation of the encoder and allows even high code-rate codes to be implemented in a highly efficient manner. Encoding methods embodying the invention can be implemented with relatively few logic gates without requiring extensive lookup tables, resulting in efficient, low cost encoder/decoder systems.

According to one aspect of the present invention there is provided a method for encoding to a magnetic recording channel a plurality of successive m-bit binary data words to produce a plurality of successive n-bit binary code words, where n and m are preselected positive integers such that n is greater than m. Each m-bit binary data words is identically partitioned into a plurality of blocks of bits. At least one of the blocks of bits of each m-bit binary data word is encoded in accordance with a finite-state coding scheme to produce a plurality of successive n-bit binary code words which are then transformed by at least one stage of violation correction. Violation correction includes detecting the occurrence of any of a plurality of prohibited bit patterns at one or more predetermined locations within each of the plurality of successive n-bit binary code words and replacing any prohibited bit pattern so detected by a corresponding substitute bit pattern. The finite-state coding scheme, prohibited bit patterns, and substitute bit patterns are predetermined, whereby, the maximum number of consecutive bits of a first value, in said plurality of successive n-bit binary code words, is limited to a first predetermined number j, where j is a positive integer which is greater or equal to 2, and the maximum number of consecutive bits of a second value is limited to a second predetermined number k, where k is a positive integer.

As indicated above, after partitioning the input data word into a number of blocks, at least one of these blocks is encoded in accordance with a finite-state coding scheme. As will be apparent from the examples detailed below, the finite-state codes employed here may be block codes, a block code being a special case of a finite-state code in that a block code is a one-state code. Where more than one block is encoded here, different finite-state codes may be employed for different blocks.

Preferred embodiments of the present invention utilize prohibited and substitute bit patterns which are defined such that quasi-catastrophic error propagation is avoided. This is achieved by imposing a further constraint whereby, a serial bit-stream, comprised of a plurality of successive n-bit binary code words, is such that the maximum number of bits in any consecutive bit-string with a four-bit period, in which two consecutive bits of a first value is followed by two consecutive bits of a second value, is limited to a third predetermined number q. Thus, the maximum length of coded bit-sequences that do not accumulate distance in sequence detection is limited to q, allowing path memory lengths in the sequence detector to be limited accordingly.

As will be appreciated, in embodiments conforming to the NRZI recording format where "1" represents a magnetic transition and "0" no transition, said bits of one value will be bits of value "1", whereby j and k represent the maximum length of series of consecutive 1's and 0's respectively.

Preferred embodiments, which advantageously utilize the methods of the present invention, provide for efficient implementation of very high code rate MTR codes, and examples for a rate 16/19 and a rate 16/17 code are detailed below. Those skilled in the art will be able to design other examples based on the techniques described herein.

It is to be appreciated that, where features are described herein with reference to a method embodying the invention, corresponding features may be provided in accordance with apparatus embodying the invention, and vice versa.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
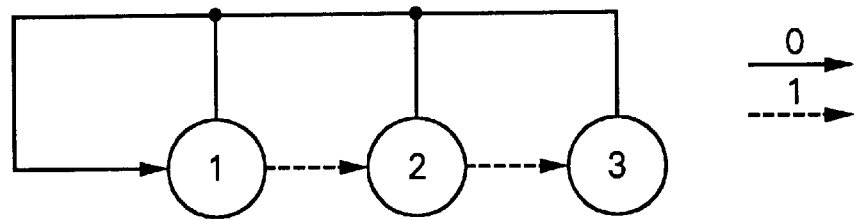
FIG. 1 depicts an illustrative embodiment of a finite state transition diagram for the MTR j=2 constraint with which the methods and systems of the present invention may advantageously be utilized.

With reference now to the figures and in particular with reference to FIG. 1, there is depicted a three-state right-resolving finite state transition diagram (FSTD) that generates bit sequences satisfying the MTR j=2 constraint. This FSTD is unique for j=2 in that it has the least number of states of all possible right resolving representations. Such an FSTD is known in the art as a "Shannon cover." FIG. 1 shows the Shannon cover for j=2. Bit sequences can be generated from the Shannon cover by starting in any of the labeled states 1, 2 or 3 and successively moving along the arrows, where the arrows shown in solid lines signify a bit of value "0", and the arrows shown in broken lines signify a bit of value "1". Examination of this diagram shows that all bit sequences that can be generated have a maximum of j=2 consecutive 1's. Reference will be made to this diagram in describing the code implemented by a first embodiment of the invention.

In general in a data storage system, such as a hard disk drive, employing an MTR code, the input data is encoded in accordance with the MTR code to produce a coded bit sequence which is supplied to the recording channel. The recording channel is typically a generalized partial response channel with rational coefficients. On the recording side, the main elements of such a system are a Reed-Solomon encoder, an MTR encoder, a precoder, and write-precompensation circuitry from which the analog recording waveform is supplied to the magnetic head for recording on the recording medium. On the data recovery side, after preamplification, automatic gain control, lowpass filtering, sampling and partial response equalization, the sample stream is supplied to a sequence detector, such as a Viterbi decoder, which produces an estimate of the coded bit-stream which may contain some illegal code words due to errors resulting in incorrect sequence detection. After inverse preceding, the estimated code word sequence is supplied to the MTR decoder for recovery of the original data, where any errors here are corrected subsequently by a Reed-Solomon decoder.

Figure 2:
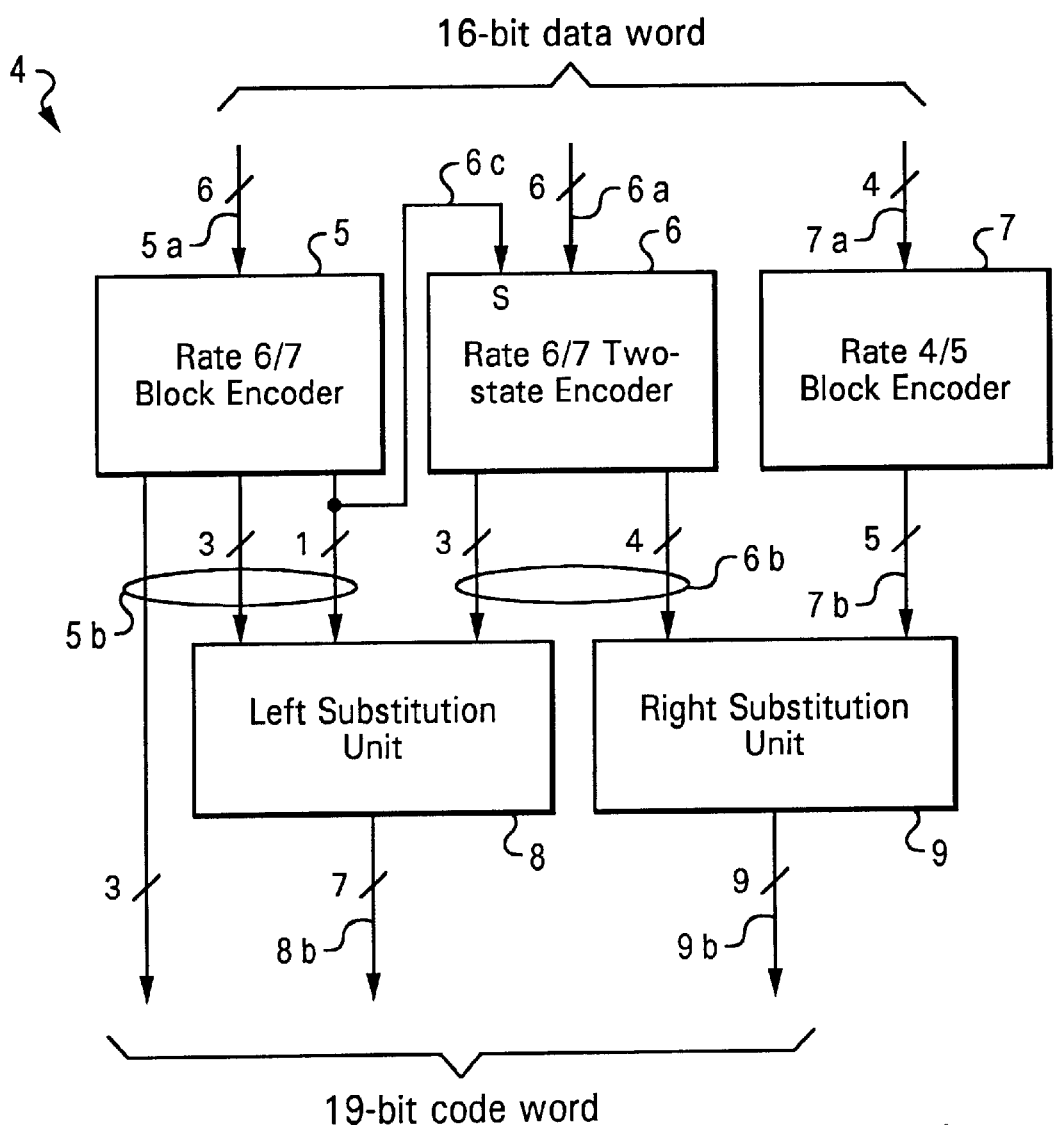
FIG. 2 is a block diagram of an encoder embodying the invention for a rate 16/19 MTR code.

FIG. 2 is a schematic block diagram of encoder apparatus according to a first embodiment of the invention in the form of MTR encoder 4 which can be utilized in such a data storage system. This embodiment implements a rate 16/19 MTR code with j=2, k=9 and q=14, referred to herein in the format MTR(j, k/q) as an MTR(2, 9/14) code. As illustrated, MTR encoder 4 comprises encoder means in the form of three input encoders 5, 6, and 7, which implement a finite-state coding scheme. The first encoder 5 is a rate 6/7 block encoder having a 6-bit data input 5a and a 7-bit output indicated generally at 5b. The second encoder 6 is a rate 6/7 two-state encoder having a 6-bit data input 6a and a 7-bit output indicated generally at 6b. The last bit-line of first encoder output 5b is connected to a 1-bit input 6c of two-state encoder 6 to set the state S thereof as explained below. Third encoder 7 is a rate 4/5 block encoder having a 4-bit data input 7a and a 5-bit output 7b. The apparatus further includes violation correction means in the form of a left substitution unit 8 and a right substitution unit 9. The right-hand four bit-lines of first encoder output 5b, and left-hand three bit-lines of second encoder output 6b, form input of left substitution unit 8 as shown. Right-hand four bit-lines of second encoder output 6b, and five bit-lines of third encoder output 7b, form input to right substitution unit 9. Together, with the left-hand three bit lines of first encoder output 5b, a 7-bit output 8b of unit 8 and 9-bit output 9b of unit 9 form the 19-bit output of the apparatus.

In operation of a recording system employing MTR encoder 4, the data to be recorded, initially in the form of a serial Reed-Solomon encoded bit-stream, is converted to 16-bit parallel form by a serial-to-parallel converter (not shown). The resulting 16-bit data words are supplied successively to MTR encoder 4 for coding. Specifically, the 16 bits of each data word are supplied to the 16 bit-lines of encoder inputs 5a, 6a and 7a which serve to partition the input word into three blocks of six, six and four bits respectively. Encoders 5 to 7 encode the input blocks in accordance with respective coding schemes to be described in detail below. The input blocks are coded to produce first, second and third subcode words on outputs 5b, 6b and 7b respectively, whereby each original 16-bit data word is converted into a 17-bit code word. The left and right substitution units 8 and 9 operate to check for violations of the coding constraints by detecting prohibited bit patterns in the bit sequences supplied to their inputs and replacing any such prohibited patterns by substitute bit patterns as described in more detail below. After this violation correction stage the 19-bit code word for the input data word appears on the 19 bit-lines forming the output of the apparatus.

The rate 6/7 block code implemented by encoder 5 is constructed as follows. Referring now to the FIG. 1. Fifty-seven potential 7-bit subcode words are generated by starting from state two in the Shannon cover and making seven transitions such that the sequence ends in states 1 or 2. The fifty-seven words in this set can be concatenated to obtain sequences satisfying the j=2 constraint. This set of words is then augmented by eleven 7-bit words that are generated by starting in state 2 in FIG. 1 and ending in state 3. The first two bits of the eleven words are either 00, 01 or 10, and the last three bits are always 011. In hexadecimal format these eleven words are 03, 0B, 13, 23, 43, 1B, 2B, 4B, 33, 53 and 5B. This gives a total of sixty-eight potential subcode words, ie. four more than are required to construct a rate 6/7 code. The words 00, 01, 4C and 33 are discarded to obtain the final set of sixty-four subcode words. Thus, encoder 5, maps each 6-bit input block to a 7-bit subcode words. The particular mapping of data blocks to subcode words as defined in the encoder is a matter of design choice and is not critical to operation of the system.

Encoder 6 implements a rate 6/7 two-state code where the last bit of the first subcode word from encoder 5 determines the current state S of encoder 6. This code is constructed as follows. There are sixty-two state-independent subcode words obtained from the same initial list of sixty-eight words discussed above by discarding the six words, in hexadecimal format 00, 4C, 33, 19, 56 and 06. The sixty-two 6-bit input blocks assigned to these 62 state-independent subcode words are preferably selected such that the logic implementation of the encoder is as simple as possible. Again, the particular one-to-one mapping of data blocks to subcode words is a matter of design choice. One out of the two remaining input blocks is mapped to the subcode word 56 is if S=0 or to the subcode word 33 if S 1. The last remaining input block is mapped to the subcode word 4C if S=0 or to the subcode word 06 if S=1.

The rate 4/5 block code implemented by the third encoder 7 is constructed as follows. A total of seventeen potential subcode words can be generated by starting from state 2 in the Shannon cover of FIG. 1 and making five transitions ending in state 1 or state 2. These are 00, 01, 02, 04, 05, 06, 08, 09, 0A, 0C, 0D, 10, 11, 12, 14, 15 and 16. Of these 00 is discarded to obtain the sixteen subcode words needed for the rate 4/5 code. This rate 4/5 block code is also disclosed in the September 1997 paper by Brickner and Moon referenced above.

None of the subcode words for the first rate 6/7 code can start with binary 11 and none of the subcode words for the rate 4/5 code can end in binary 11. Thus, violation of the j=2 constraint across the boundaries of 19-bit code words is not possible. However, violations could occur at the boundary between the two 7-bit subcode words output by encoders 5 and 6, or at the boundary between the 7-bit output of encoder 6 and the 5-bit output of encoder 7. This is dealt with in the violation correction stage implemented by substitution units 8 and 9 as follows.

The prohibited bit patterns, and the substitute patterns with which they are replaced in left substitution unit 8 are defined in Table 1 below, where the 19-bit sequence output by encoders 5 to 7 is represented by $y^1, y^2, y^3, \ldots, y$.

TABLE 1

| Prohibited Pattern | | | | | | | Substitute Pattern | | | | | | |
| --- | --- | --- | --- | --- | --- | --- | --- | --- | --- | --- | --- | --- | --- |
| $y^4$ | $y^5$ | $y^6$ | $y^7$ | $y^8$ | $y^9$ | $y^{10}$ | $y^4$ | $y^5$ | $y^6$ | $y^7$ | $y^8$ | $y^9$ | $y^{10}$ |
| $y^4$ | 0 | 1 | 1 | 1 | 0 | 0 | $y^4$ | 0 | 1 | 0 | 1 | 1 | 0 |
| 0 | 0 | 1 | 1 | 1 | 0 | 1 | 0 | 1 | 0 | 0 | 1 | 1 | 0 |
| 1 | 0 | 1 | 1 | 1 | 0 | 1 | 0 | 1 | 1 | 0 | 1 | 1 | 0 |
| $y^4$ | 0 | 0 | 0 | 0 | 0 | 0 | $y^4$ | 0 | 0 | 0 | 1 | 1 | 0 |

Similarly, the prohibited bit patterns, and the substitute patterns with which they are replaced in right substitution unit 9 are defined in Table 2 below.

TABLE 2

| Prohibited Pattern | | | | | | | | | Substitute Pattern | | | | | | | | |
| --- | --- | --- | --- | --- | --- | --- | --- | --- | --- | --- | --- | --- | --- | --- | --- | --- | --- |
| $y^{11}$ | $y^{12}$ | $y^{13}$ | $y^{14}$ | $y^{15}$ | $y^{16}$ | $y^{17}$ | $y^{18}$ | $y^{19}$ | $y^{11}$ | $y^{12}$ | $y^{13}$ | $y^{14}$ | $y^{15}$ | $y^{16}$ | $y^{17}$ | $y^{18}$ | $y^{19}$ |
| $y^{11}$ | 0 | 1 | 1 | 1 | 0 | 0 | $y^{18}$ | $y^{19}$ | $y^{11}$ | 0 | 1 | 0 | 1 | 1 | 0 | $y^{18}$ | $y^{19}$ |
| $y^{11}$ | $_n0$ | 1 | 1 | 1 | 0 | 1 | $y^{18}$ | $y^{19}$ | $y^{11}$ | 0 | 0 | 0 | 1 | 1 | 0 | $y^{18}$ | $y^{19}$ |
| 0 | 0 | 0 | 0 | 0 | 0 | 0 | $y^{18}$ | $y^{19}$ | 0 | 1 | 1 | 0 | 1 | 1 | 0 | $y^{18}$ | $y^{19}$ |
| 0 | 0 | 1 | 1 | 0 | 0 | 1 | 1 | 0 | 0 | 1 | 0 | 0 | 1 | 1 | 0 | 1 | 0 |

In these tables, the patterns marked in bold in the left-hand column are those which are sufficient to determine if a substitution should be performed.

After each substitution unit 8, 9 has detected and replaced any prohibited bit patterns, any violations of the j constraint at subcode word boundaries will have been corrected. In addition, the substitutions reduce k and q to 9 and 14 respectively, to shorten the path memory required in the sequence detector and to aid timing recovery and gain control.

MTR encoder 4 thus implements a rate 16/19 MTR(2, 9/14) code which, in addition to the high code rate, has a high efficiency. The efficiency of a code is defined as the ratio of the code rate to the capacity (maximum possible code rate). The capacity associated with the present coding restraints has been computed to be 0.877210, resulting in an efficiency for the present code of 95.99%. It will be appreciated that the partitioned block structure allows a particularly simple implementation in the encoding apparatus, and hence in the corresponding decoder apparatus to be described below. It has been determined that only 369 binary input logic gates are required for implementation of the encoder and decoder apparatus. By way of example, a particularly preferred Boolean logic design for MTR encoder 4 is fully specified at the end of this description. The maximum length of encoded sequences that do not accumulate distance has been limited to q=14, whereby quasi-catastrophic error propagation has been avoided. The maximum length of magnet required in the recording system is k+1=10, and it can be shown that any error burst of size up to 7 bits, 8 bits and 26 bits at the output of the inverse precoder in a recording channel will affect at most 2, 3 and 4 bytes respectively at the output of the MTR decoder, ie. at the input to the Reed-Solomon decoder.

Figure 3:
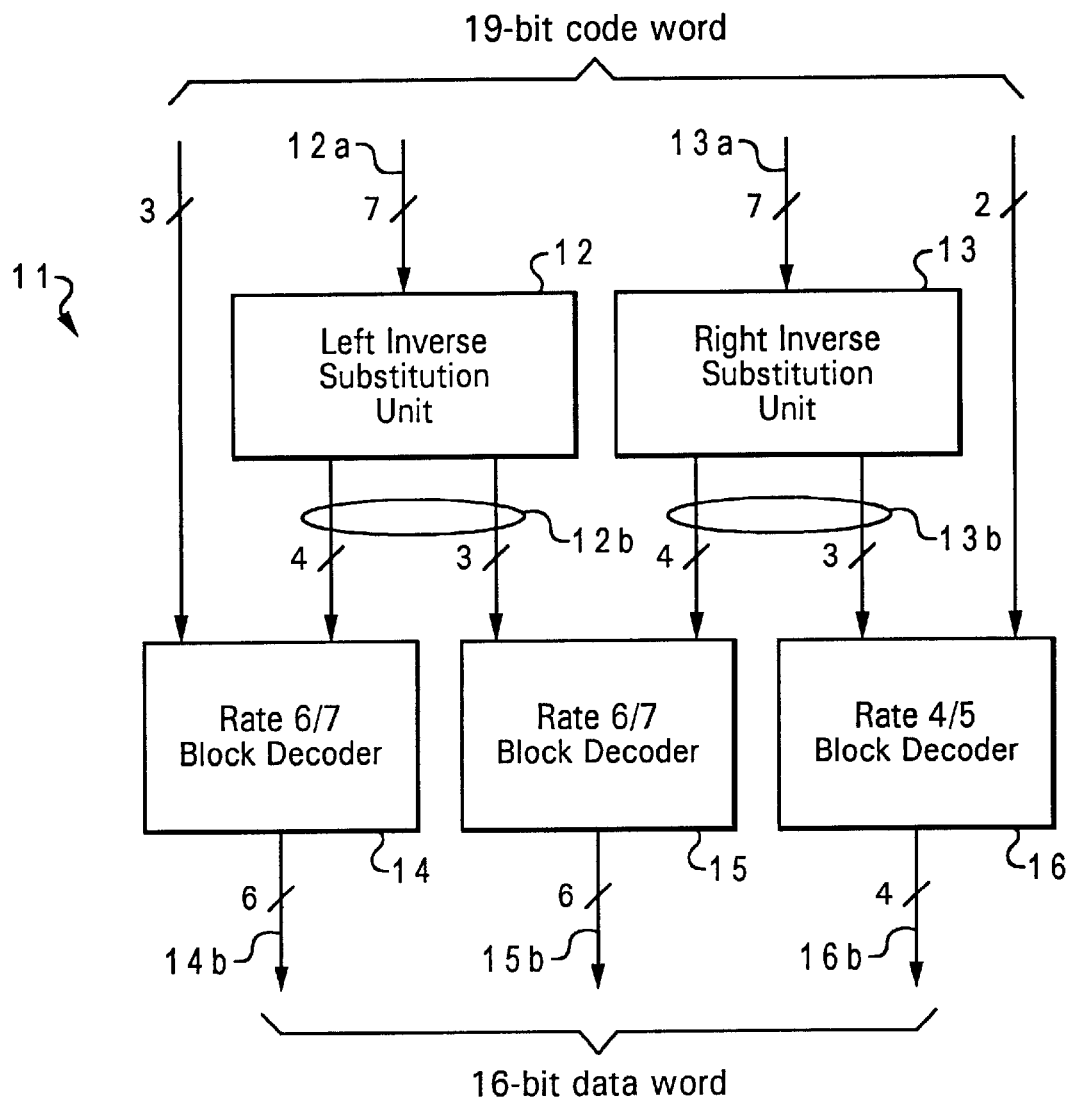
FIG. 3 is a block diagram of a decoder for use with the encoder of FIG. 2 in a system embodying the invention.

FIG. 3 illustrates an embodiment of decoder apparatus in the form of MTR decoder 11 for a system employing MTR encoder 4 described above. The operation of the MTR decoder 11 will be apparent to those skilled in the art from the foregoing detailed description of the MTR encoder. Briefly, however, MTR decoder 11 comprises left and right inverse substitution units 12 and 13 with respective inputs 12a and 13a and outputs 12b and 13b. The bit-lines of the outputs 12b and 13b are connected as shown to decoder means in the form of first and second rate 6/7 block decoders 14 and 15 and a rate 4/5 block decoder 16. The first three bits of the input 19-bit code word are supplied as indicated to the decoder 14, and the last two bits of the code word are supplied as indicated to decoder 16. The left inverse substitution unit 12 detects the bit patterns shown on the right-hand side of Table 1 and replaces these by the bit patterns shown on the left-hand side of the table. Similarly, the right-hand substitution unit 13 detects and replaces bit patterns shown on the right-hand side of Table 2 by the patterns shown on the left-hand side of this table. The patterns shown in bold in the right-hand columns of these tables are those which are sufficient to determine if a substitution should be performed. Decoders 14, 15 and 16 perform the inverse mappings of those performed by encoders 5, 6 and 7 respectively, and outputs 14b, 15b and 16b of decoders 14, 15 and 16 collectively comprise sixteen bit-lines on which the original 16-bit data word is output in operation. As mentioned earlier, there will of course be occasions when the 17-bit input to MTR decoder 11 is an illegal code word. In these cases, MTR decoder output is preferably selected to simplify the logic as far as possible. By way of example, a particularly preferred boolean logic design for MTR decoder 11 is fully specified at the end of this description.

Figure 4:
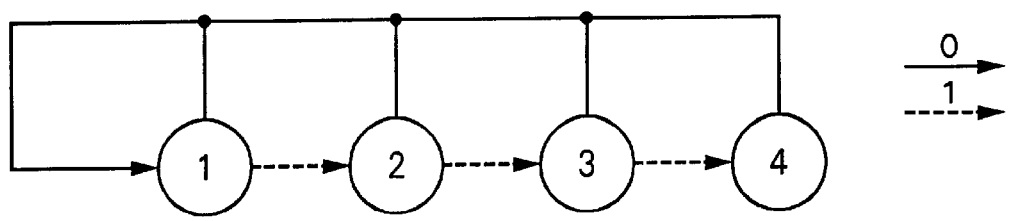
FIG. 4 shows a finite state transition diagram for the MTR j=3 constraint.
Figure 5:
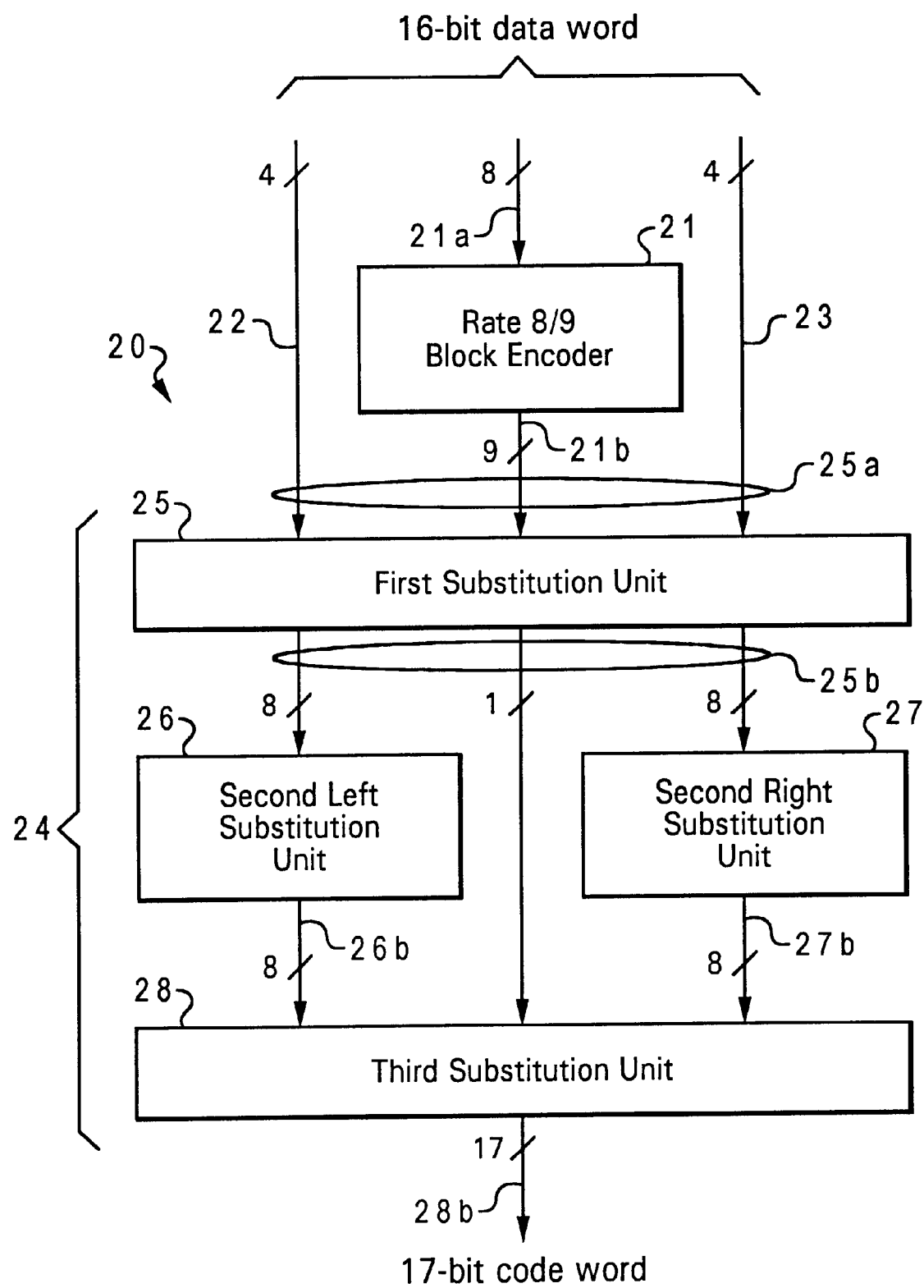
FIG. 5 is a block diagram of an encoder embodying the invention for a rate 16/17 MTR code.
Figure 6:
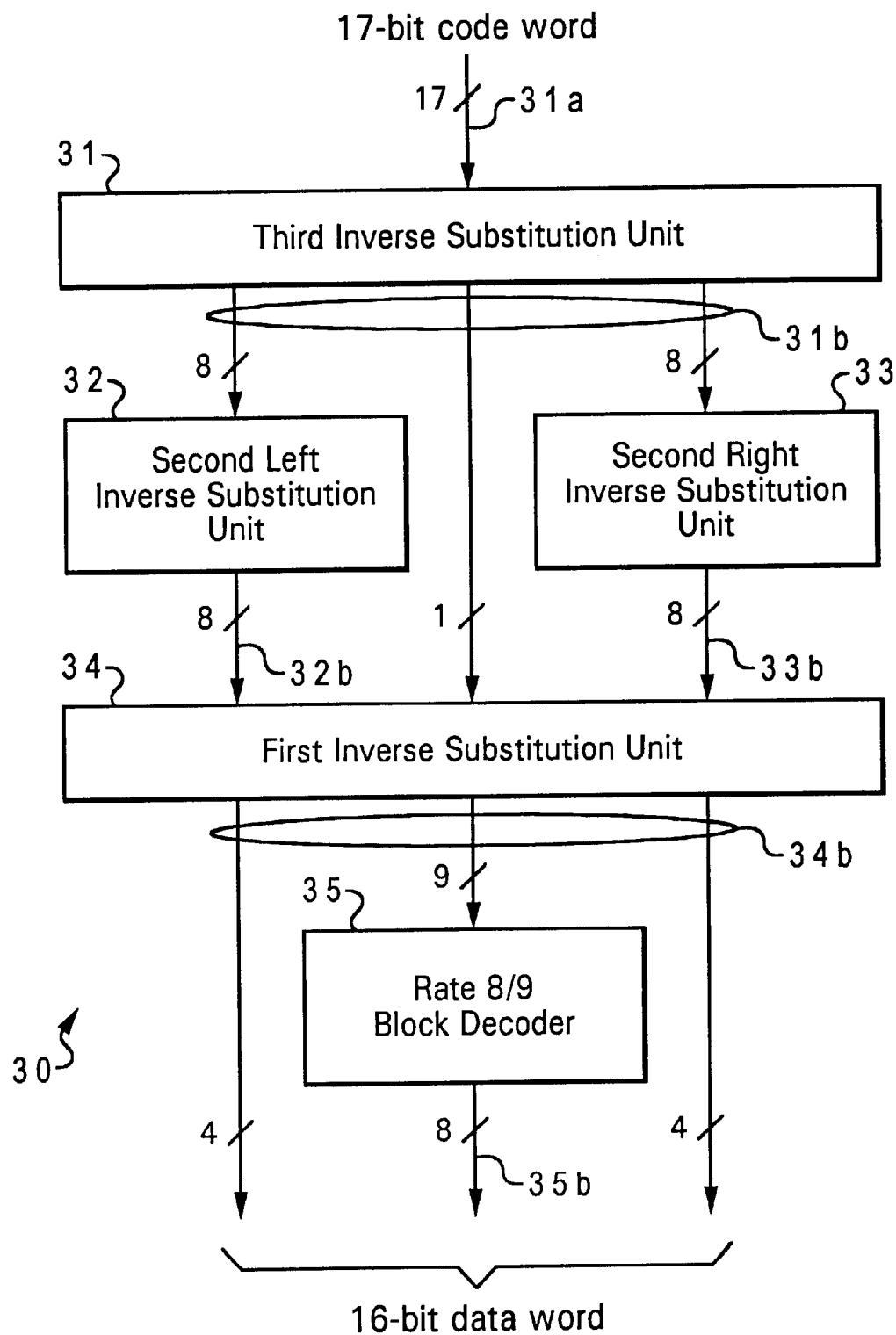
FIG. 6 is a block diagram of a decoder for use with the encoder of FIG. 5 in a system embodying the invention.

A second embodiment of the invention is described in FIGS. 4 to 6. FIG. 4 illustrates the Shannon cover for the MTR j=3 constraint, whereby any sequence generated from this diagram has no more than three consecutive 1's. Reference will be made to this diagram in describing the operation of the encoder apparatus shown in FIG. 5.

FIG. 5 is a schematic block diagram of encoder circuit in the form of MTR encoder 20 for implementing a rate 16/17 MTR code for which the maximum number of consecutive 1's in the encoded output is four. However, the locations at which these maximum transition runs can occur in the coded bit-sequence are limited, and for all other locations the maximum number of consecutive 1's is three. More specifically, the code is constructed such that the run of four 1's can occur at bit positions as well as code word boundaries, ie. at bit positions Thus j=4 for two out of the possible seventeen locations, and for all of the other fifteen locations j=3. This code will be referred to herein as an MTR(3/4(2)) code with period l=17, signifying that j=3 except that, in 2 of the 17 possible locations, j=4, and the maximum run of four 1's can occur every l=17 bits. In addition to this j constraint, the code implemented by encoder 20 satisfies the additional constraints k=14 and q=22.

As illustrated in FIG. 5 MTR encoder 20 comprises finite-state encoder in the form of a rate 8/9 block encoder 21 having an 8-bit input 21a and a 9-bit output 21b. The apparatus has two further 4-bit inputs shown at 22 and 23 which receive the first and last four bits respectively of the input 16-bit code word in use. The violation correction means in this embodiment is indicated generally at 24 and performs three stages of violation correction. The first stage is implemented by a first substitution unit 25 having a 17-bit parallel input 25a made up of the four bit-lines of input 22, the nine bit-lines of encoder output 21b, and four bit-lines of input 23. First substitution unit 25 has a 17-bit output indicated generally at 25b. The second violation correction stage is implemented by a second left substitution unit 26 and a second right substitution unit 27. The first eight bit-lines of output 25b of first substitution unit 25 form the input to second left substitution unit 26, and the last eight bit-lines of output 25b form the input to second right substitution unit 27. This connection of the different groups of bit-lines of the output 25b thus serves to partition the 17-bit sequence into three blocks of eight, one and eight bits respectively, the two 8-bit blocks being supplied to the second left and second right substitution units 26 and 27 as shown. The left and right substitution units 26 and 27 have respective outputs 26b and 27b which, together with the ninth bit-line of first substitution unit output 25b, form the 17-bit input to the third violation correction stage. This stage is implemented by a third substitution unit 28 having a 17-bit output 28b forming the output of encoder 20.

In operation, a 16-bit data word from the serial-to-parallel converter (not shown) is supplied to the sixteen bit-lines of inputs 22, 21a and 23 which serve to partition the input word into three blocks of four, eight and four bits respectively. Encoder 21 encodes the 8-bit input block in accordance with a coding scheme to be described below to produce a 9-bit subcode word on output 21b. The resulting bit-sequence derived from the input 16-bit data word and supplied to input 25a of the first substitution unit is therefore a 17-bit sequence. Violations of the coding constraints are detected and corrected by the three stages of violation correction as detailed below, whereby the 17-bit code word for the input data word appears on output 28b.

The rate 8/9 code implemented by encoder 21 is constructed as follows. Referring to FIG. 4, 249 subcode words are obtained by starting in state 3 of this diagram and making nine transitions ending in states 1 or 2. Added to this set of 249 words are six 9-bit subcode words that do not start or end with binary 11 and have the binary pattern 011110 at their center. In hexadecimal format, these words are 03C, 0BC, 13C, 03D, 0BD and 13D. The final subcode word is selected as 1EF, that is binary 111101111. Since each 9-bit subcode word on encoder output 21b in FIG. 5 is preceded and followed by four uncoded bits at input 25a to the first substitution unit, there are exactly 256 possible 17-bit sequences that have the 9-bit subcode word 1EF at their center, ie. at bit-positions $y^5$ to $y^1$. These sequences are detected as prohibited bit sequences by first substitution unit 25 and replaced by respective substitute bit patterns in accordance with Table 3 below. In the following tables the bold patterns are those which are sufficient to determine if substitution, or inverse substitution, should be performed.

TABLE 3

Prohibited Pattern

| $y^1$ | $y^2$ | $y^3$ | $y^4$ | $y^5$ | $y^6$ | $y^7$ | $y^8$ | $y^9$ | $y^{10}$ | $y^{11}$ | $y^{12}$ | $y^{13}$ | $y^{14}$ | $y^{15}$ | $y^{16}$ | $y^{17}$ |
|---|---|---|---|---|---|---|---|---|---|---|---|---|---|---|---|---|
| 0 | 0 | 0 | 1 | 1 | 1 | 1 | 1 | 0 | 1 | 1 | 1 | 1 | $y^{14}$ | $y^{15}$ | $y^{16}$ | $y^{17}$ |
| 0 | 0 | 1 | 1 | 1 | 1 | 1 | 1 | 0 | 1 | 1 | 1 | 1 | $y^{14}$ | $y^{15}$ | $y^{16}$ | $y^{17}$ |
| 0 | 1 | 0 | 1 | 1 | 1 | 1 | 1 | 0 | 1 | 1 | 1 | 1 | $y^{14}$ | $y^{15}$ | $y^{16}$ | $y^{17}$ |
| 0 | 1 | 1 | 1 | 1 | 1 | 1 | 1 | 0 | 1 | 1 | 1 | 1 | $y^{14}$ | $y^{15}$ | $y^{16}$ | $y^{17}$ |
| 1 | 0 | 0 | 1 | 1 | 1 | 1 | 1 | 0 | 1 | 1 | 1 | 1 | $y^{14}$ | $y^{15}$ | $y^{16}$ | $y^{17}$ |
| 1 | 0 | 1 | 1 | 1 | 1 | 1 | 1 | 0 | 1 | 1 | 1 | 1 | $y^{14}$ | $y^{15}$ | $y^{16}$ | $y^{17}$ |
| 1 | 1 | 0 | 1 | 1 | 1 | 1 | 1 | 0 | 1 | 1 | 1 | 1 | $y^{14}$ | $y^{15}$ | $y^{16}$ | $y^{17}$ |
| 1 | 1 | 1 | 1 | 1 | 1 | 1 | 1 | 0 | 1 | 1 | 1 | 1 | $y^{14}$ | $y^{15}$ | $y^{16}$ | $y^{17}$ |
| $y^1$ | $y^2$ | $y^3$ | 0 | 1 | 1 | 1 | 1 | 0 | 1 | 1 | 1 | 1 | $y^{14}$ | 0 | 0 | 0 |
| $y^1$ | $y^2$ | $y^3$ | 0 | 1 | 1 | 1 | 1 | 0 | 1 | 1 | 1 | 1 | $y^{14}$ | 1 | 0 | 0 |
| $y^1$ | $y^2$ | $y^3$ | 0 | 1 | 1 | 1 | 1 | 0 | 1 | 1 | 1 | 1 | $y^{14}$ | 0 | 1 | 0 |
| $y^1$ | $y^2$ | $y^3$ | 0 | 1 | 1 | 1 | 1 | 0 | 1 | 1 | 1 | 1 | $y^{14}$ | 1 | 1 | 0 |
| $y^1$ | $y^2$ | $y^3$ | 0 | 1 | 1 | 1 | 1 | 0 | 1 | 1 | 1 | 1 | $y^{14}$ | 0 | 0 | 1 |
| $y^1$ | $y^2$ | $y^3$ | 0 | 1 | 1 | 1 | 1 | 0 | 1 | 1 | 1 | 1 | $y^{14}$ | 1 | 0 | 1 |
| $y^1$ | $y^2$ | $y^3$ | 0 | 1 | 1 | 1 | 1 | 0 | 1 | 1 | 1 | 1 | $y^{14}$ | 0 | 1 | 1 |
| $y^1$ | $y^2$ | $y^3$ | 0 | 1 | 1 | 1 | 1 | 0 | 1 | 1 | 1 | 1 | $y^{14}$ | 1 | 1 | 1 |

Substitute Pattern

| $y^1$ | $y^2$ | $y^3$ | $y^4$ | $y^5$ | $y^6$ | $y^7$ | $y^8$ | $y^9$ | $y^{10}$ | $y^{11}$ | $y^{12}$ | $y^{13}$ | $y^{14}$ | $y^{15}$ | $y^{16}$ | $y^{17}$ |
|---|---|---|---|---|---|---|---|---|---|---|---|---|---|---|---|---|
| 0 | 1 | 1 | 0 | 1 | 0 | 0 | 1 | 1 | 0 | 0 | 0 | 0 | $y^{14}$ | $y^{15}$ | $y^{16}$ | $y^{17}$ |
| 0 | 1 | 1 | 0 | 1 | 0 | 0 | 1 | 1 | 0 | 0 | 0 | 1 | $y^{14}$ | $y^{15}$ | $y^{16}$ | $y^{17}$ |
| 0 | 1 | 1 | 0 | 1 | 0 | 0 | 1 | 1 | 0 | 0 | 1 | 0 | $y^{14}$ | $y^{15}$ | $y^{16}$ | $y^{17}$ |
| 0 | 1 | 1 | 0 | 1 | 0 | 0 | 1 | 1 | 0 | 1 | 0 | 1 | $y^{14}$ | $y^{15}$ | $y^{16}$ | $y^{17}$ |
| 0 | 1 | 1 | 0 | 1 | 0 | 0 | 1 | 1 | 1 | 0 | 0 | 0 | $y^{14}$ | $y^{15}$ | $y^{16}$ | $y^{17}$ |
| 0 | 1 | 1 | 0 | 1 | 0 | 0 | 1 | 1 | 1 | 0 | 0 | 1 | $y^{14}$ | $y^{15}$ | $y^{16}$ | $y^{17}$ |
| 0 | 1 | 1 | 0 | 1 | 0 | 0 | 1 | 1 | 1 | 0 | 1 | 0 | $y^{14}$ | $y^{15}$ | $y^{16}$ | $y^{17}$ |
| 0 | 1 | 1 | 0 | 1 | 0 | 0 | 1 | 1 | 0 | 1 | 0 | 0 | $y^{14}$ | $y^{15}$ | $y^{16}$ | $y^{17}$ |
| $y^1$ | $y^2$ | $y^3$ | $y^4$ | 0 | 0 | 0 | 0 | 1 | 1 | 0 | 1 | 1 | 0 | 1 | 1 | 0 |
| $y^1$ | $y^2$ | $y^3$ | $y^4$ | 1 | 0 | 0 | 0 | 1 | 1 | 0 | 1 | 1 | 0 | 1 | 1 | 0 |
| $y^1$ | $y^2$ | $y^3$ | $y^4$ | 0 | 1 | 0 | 0 | 1 | 1 | 0 | 1 | 1 | 0 | 1 | 1 | 0 |
| $y^1$ | $y^2$ | $y^3$ | $y^4$ | 1 | 0 | 1 | 0 | 1 | 1 | 0 | 1 | 1 | 0 | 1 | 1 | 0 |
| $y^1$ | $y^2$ | $y^3$ | $y^4$ | 0 | 0 | 0 | 1 | 1 | 0 | 1 | 1 | 0 | 1 | 1 | 0 |
| $y^1$ | $y^2$ | $y^3$ | $y^4$ | 1 | 0 | 0 | 1 | 1 | 0 | 1 | 1 | 0 | 1 | 1 | 0 |
| $y^1$ | $y^2$ | $y^3$ | $y^4$ | 0 | 1 | 0 | 1 | 1 | 0 | 1 | 1 | 0 | 1 | 1 | 0 |
| $y^1$ | $y^2$ | $y^3$ | $y^4$ | 0 | 0 | 1 | 0 | 1 | 1 | 0 | 1 | 1 | 0 | 1 | 1 | 0 |

The first eight bits of the 17-bit sequence output by first substitution unit 2 are received by second left substitution unit 26 which detects and replaces prohibited bit patterns in accordance with Table 4 below.

TABLE 4

Prohibited Pattern

| $y^1$ | $y^2$ | $y^3$ | $y^4$ | $y^5$ | $y^6$ | $y^7$ | $y^8$ |
|---|---|---|---|---|---|---|---|
| 1 | 1 | 1 | 1 | 1 | 0 | $y^7$ | $y^8$ |
| 1 | 1 | 1 | 1 | 0 | 1 | 1 | $y^8$ |
| 1 | 1 | 1 | 1 | 0 | 0 | 1 | $y^8$ |
| 1 | 1 | 1 | 1 | 0 | 1 | 0 | $y^8$ |
| 1 | 1 | 1 | 1 | 0 | 0 | 0 | $y^8$ |
| 1 | 1 | 1 | 0 | 0 | 0 | $y^7$ | $y^8$ |
| 1 | 1 | 1 | 0 | 0 | 1 | $y^7$ | $y^8$ |
| 1 | 1 | 1 | 0 | 1 | 0 | $y^7$ | $y^8$ |
| 0 | 1 | 1 | 1 | 1 | 0 | $y^7$ | $y^8$ |
| 0 | 0 | 0 | 0 | 0 | 0 | 0 | 0 |

Substituted Pattern

| $y^1$ | $y^2$ | $y^3$ | $y^4$ | $y^5$ | $y^6$ | $y^7$ | $y^8$ |
|---|---|---|---|---|---|---|---|
| 1 | 1 | 0 | $y^7$ | 1 | 1 | 0 | $y^8$ |
| $y^8$ | 0 | 1 | 0 | 1 | 1 | 1 | 0 |
| 0 | 1 | 0 | 1 | 1 | 1 | 0 | $y^8$ |
| 1 | 0 | 0 | 1 | 1 | 1 | 0 | $y^8$ |
| 0 | 0 | 0 | 1 | 1 | 1 | 0 | $y^8$ |
| 0 | 0 | $y^7$ | 0 | 1 | 1 | 0 | $y^8$ |
| 0 | 1 | $y^7$ | 0 | 1 | 1 | 0 | $y^8$ |

TABLE 4-continued

| | | | | | | | |
|---|---|---|---|---|---|---|---|
| 1 | 0 | $y^7$ | 0 | 1 | 1 | 0 | $y^8$ |
| $y^7$ | $y^8$ | 0 | 0 | 1 | 1 | 1 | 0 |
| 0 | 1 | 1 | 0 | 1 | 1 | 1 | 0 |

The last eight bits of the 17-bit sequence output by first substitution unit 2 are received by second right substitution unit 27 which detects and replaces prohibited bit patterns in accordance with Table 5 below. It will be seen that Table 5 is a mirror image of Table 4.

TABLE 5

Prohibited Pattern

| $y^{10}$ | $y^{11}$ | $y^{12}$ | $y^{13}$ | $y^{14}$ | $y^{15}$ | $y^{16}$ | $y^{17}$ |
|---|---|---|---|---|---|---|---|
| $y^{10}$ | $y^{11}$ | 0 | 1 | 1 | 1 | 1 | 1 |
| $y^{10}$ | 1 | 1 | 0 | 1 | 1 | 1 | 1 |
| $y^{10}$ | 1 | 0 | 0 | 1 | 1 | 1 | 1 |
| $y^{10}$ | 0 | 1 | 0 | 1 | 1 | 1 | 1 |
| $y^{10}$ | 0 | 0 | 0 | 1 | 1 | 1 | 1 |
| $y^{10}$ | $y^{11}$ | 0 | 0 | 0 | 1 | 1 | 1 |

TABLE 5-continued

| | | | | | | | |
|---|---|---|---|---|---|---|---|
| $y^{10}$ | $y^{11}$ | 1 | 0 | 0 | 1 | 1 | 1 |
| $y^{10}$ | $y^{11}$ | 0 | 1 | 0 | 1 | 1 | 1 |
| $y^{10}$ | $y^{11}$ | 0 | 1 | 1 | 1 | 1 | 0 |
| 0 | 0 | 0 | 0 | 0 | 0 | 0 | 0 |

Substitute Pattern

| $y^{10}$ | $y^{11}$ | $y^{12}$ | $y^{13}$ | $y^{14}$ | $y^{15}$ | $y^{16}$ | $y^{17}$ |
|---|---|---|---|---|---|---|---|
| $y^{10}$ | 0 | 1 | 1 | $y^{11}_n$ | 0 | 1 | 1 |
| 0 | 1 | 1 | 1 | 0 | 1 | 0 | $y^{10}$ |
| $y^{10}$ | 0 | 1 | 1 | 1 | 0 | 1 | 0 |
| $y^{10}$ | 0 | 1 | 1 | 1 | 0 | 0 | 1 |
| $y^{10}$ | 0 | 1 | 1 | 1 | 0 | 0 | 0 |
| $y^{10}$ | 0 | 1 | 1 | 0 | $y^{11}$ | 0 | 0 |
| $y^{10}$ | 0 | 1 | 1 | 0 | $y^{11}$ | 1 | 0 |
| $y^{10}$ | 0 | 1 | 1 | 0 | $y^{11}$ | 0 | 1 |
| 0 | 1 | 1 | 1 | 0 | 0 | $y^{10}$ | $y^{11}$ |
| 0 | 1 | 1 | 1 | 0 | 1 | 1 | 0 |

After the second stage of violation correction third substitution unit 28 detects and replaces prohibited bit patterns in its 17-bit input in accordance with Table 6 below.

TABLE 6

Prohibited Pattern

| $y^1$ | $y^2$ | $y^3$ | $y^4$ | $y^5$ | $y^6$ | $y^7$ | $y^8$ | $y^9$ | $y^{10}$ | $y^{11}$ | $y^{12}$ | $y^{13}$ | $y^{14}$ | $y^{15}$ | $y^{16}$ | $y^{17}$ |
|---|---|---|---|---|---|---|---|---|---|---|---|---|---|---|---|---|
| 0 | 0 | 1 | 1 | 0 | 0 | 1 | 1 | 0 | 0 | 1 | 1 | $y^{13}$ | $y^{14}$ | $y^{15}$ | $y^{16}$ | $y^{17}$ |
| 0 | 1 | 1 | 0 | 0 | 1 | 1 | 0 | 0 | 1 | 1 | 0 | $y^{13}$ | $y^{14}$ | $y^{15}$ | $y^{16}$ | $y^{17}$ |
| 1 | 1 | 0 | 0 | 1 | 1 | 0 | 0 | 1 | 1 | 0 | 0 | $y^{13}$ | $y^{14}$ | $y^{15}$ | $y^{16}$ | $y^{17}$ |
| 1 | 0 | 0 | 1 | 1 | 0 | 0 | 1 | 1 | 0 | 0 | 1 | $y^{13}$ | $y^{14}$ | $y^{15}$ | $y^{16}$ | $y^{17}$ |
| $y^1$ | $y^2$ | $y^3$ | $y^4$ | $y^5$ | 1 | 1 | 0 | 0 | 1 | 1 | 0 | 0 | 1 | 1 | 0 | 0 |
| $y^1$ | $y^2$ | $y^3$ | $y^4$ | $y^5$ | 0 | 1 | 1 | 0 | 0 | 1 | 1 | 0 | 0 | 1 | 1 | 0 |
| $y^1$ | $y^2$ | $y^3$ | $y^4$ | $y^5$ | 0 | 0 | 1 | 1 | 0 | 0 | 1 | 1 | 0 | 0 | 1 | 1 |
| $y^1$ | $y^2$ | $y^3$ | $y^4$ | $y^5$ | 1 | 0 | 0 | 1 | 1 | 0 | 0 | 1 | 1 | 0 | 0 | 1 |
| 1 | 0 | 0 | 0 | 0 | 0 | 0 | 0 | 0 | 0 | 0 | 0 | 0 | 0 | 0 | 0 | 1 |

Substitute Pattern

| $y^1$ | $y^2$ | $y^3$ | $y^4$ | $y^5$ | $y^6$ | $y^7$ | $y^8$ | $y^9$ | $y^{10}$ | $y^{11}$ | $y^{12}$ | $y^{13}$ | $y^{14}$ | $y^{15}$ | $y^{16}$ | $y^{17}$ |
|---|---|---|---|---|---|---|---|---|---|---|---|---|---|---|---|---|
| 1 | 0 | 1 | 0 | 1 | 1 | 1 | 0 | 1 | 0 | 1 | 0 | $y^{13}$ | $y^{14}$ | $y^{15}$ | $y^{16}$ | $y^{17}$ |
| 1 | 0 | 1 | 0 | 1 | 1 | 1 | 0 | 1 | 1 | 1 | 0 | $y^{13}$ | $y^{14}$ | $y^{15}$ | $y^{16}$ | $y^{17}$ |
| 1 | 0 | 1 | 0 | 1 | 1 | 1 | 0 | 1 | 0 | 0 | 0 | $y^{13}$ | $y^{14}$ | $y^{15}$ | $y^{16}$ | $y^{17}$ |
| 1 | 0 | 1 | 0 | 1 | 1 | 1 | 0 | 1 | 0 | 0 | 1 | $y^{13}$ | $y^{14}$ | $y^{15}$ | $y^{16}$ | $y^{17}$ |
| $y^1$ | $y^2$ | $y^3$ | $y^4$ | $y^5$ | 0 | 1 | 0 | 1 | 0 | 1 | 1 | 1 | 0 | 1 | 0 | 1 |
| $y^1$ | $y^2$ | $y^3$ | $y^4$ | $y^5$ | 0 | 1 | 1 | 1 | 0 | 1 | 1 | 1 | 0 | 1 | 0 | 1 |
| $y^1$ | $y^2$ | $y^3$ | $y^4$ | $y^5$ | 0 | 0 | 1 | 1 | 0 | 1 | 1 | 1 | 0 | 1 | 0 | 1 |
| $y^1$ | $y^2$ | $y^3$ | $y^4$ | $y^5$ | 1 | 0 | 0 | 1 | 0 | 1 | 1 | 1 | 0 | 1 | 0 | 1 |
| 1 | 1 | 0 | 1 | 1 | 1 | 0 | 1 | 1 | 1 | 0 | 0 | 0 | 0 | 0 | 0 | 1 |

Prohibited bit patterns are detected and replaced by the three stages of violation correction, whereby any violations of the j constraint are corrected. In addition, the substitutions reduce k and q to 11 and 22 respectively, to shorten the path memory and aid timing recovery and gain control.

MTR encoder 20 thus implements a rate 16/17 MTR(3/4(2), 14/22) code with period l=17 which has a high efficiency in addition to the high code rate. The capacity for the j=3/4(2) constraint with period l=17 is 0.950352. This value presents an upper bound for the capacity of a constrained system satisfying j=3/4(2) with period l=17, k=14 and q=22, and can be used in computation of the efficiency of the present code. A lower bound on the efficiency is therefore 99.03%. The partitioned block structure allows a particularly simple implementation in the encoding apparatus, and hence in the corresponding decoder apparatus to be described below. It has been determined that the encoder and decoder apparatus can be implemented with only 713 binary input logic gates. By way of example, a particularly preferred Boolean logic design for MTR encoder 20 is fully specified at the end of this description. The maximum length of encoded sequences that do not accumulate distance has been limited to q=22, whereby quasi-catastrophic error propagation has been avoided. The maximum length of magnet required in the recording system is k+1=15, and any error burst of size up to 18 bits at the output of the inverse precoder will affect at most 4 bytes at the output of MTR decoder 20.

FIG. 6 illustrates an embodiment of decoder apparatus in the form of MTR decoder 30 for a system employing MTR encoder 20 of FIG. 5. Again, the operation of the decoder apparatus will be apparent to those skilled in the art from the foregoing detailed description of the encoding process. Decoder 30 comprises three stages of inverse substitution corresponding to the three violation correction stages of the encoder apparatus. A third inverse substitution unit 31 has a 17-bit input 31*a* and a 17-bit output 31*b* which is partitioned as shown into groups of eight, four and eight bit-lines respectively. This inverse substitution unit detects and replaces the bit patterns shown on the right-hand side of Table 6 with the patterns shown on the left-hand side of this table. The second stage of inverse substitution is implemented by second left and second right inverse substitution units 32 and 33 having respective 8-bit outputs 32*b* and 33*b*. Unit 32 detects and replaces the bit patterns shown on the right-hand side of Table 4 with the patterns shown on the left-hand side of this table. Similarly, unit 33 performs the inverse substitutions defined by Table 5. Outputs 32*b* and 33*b*, together with the central bit line of the output 31*b* of the third inverse substitution unit, form the input to the final inverse substitution stage. This is implemented by a first inverse substitution unit 34 which performs the inverse substitutions defined in Table 3. A 17-bit output 34*b* of the unit 34 is partitioned as shown into groups of four, nine and four bit-lines respectively. The group of nine bit-lines forms the input to a rate 8/9 block decoder 35 which performs the mapping inverse to those performed by the block encoder 21 in FIG. 5. The 8-bit output 35*b* of the block decoder, together with the two groups of four bit-lines from the inverse substitution unit 34, form the 16-bit output of the apparatus on which the original 16-bit data word is output in operation. As before, the MTR decoder output in the case of illegal input code words is selected so as to simplify the decoder logic as far as possible. By way of example, a particularly preferred Boolean logic design for MTR decoder 30 is fully specified below.

Boolean Logic Design for MTR Encoder 4 MTR Decoder 11

This section specifies a highly efficient Boolean implementation for encoder 4 and decoder 11 of the rate 16/19 MTR(2, 9/14) code discussed above. Encoder 4 and decoder 11 can be implemented with a total of 369 binary-input logic gates. In the following, the operations ~, & and | stand for the boolean operations NOT, AND and OR, respectively. In the encoder logic, x(1) to x(16) represent the sixteen bits supplied to the sixteen bit-lines of MTR encoder input 5a, 6a, 7a from left to right in FIG. 2; k1 represents the 1-bit of input 6c; and y(1) to y(19) represent the nineteen bits of MTR encoder output from left to right in FIG. 2. In the decoder logic, y(1) to y(19) represent the nineteen bits of the input word from left to right in FIG. 3; yy(1) to yy(19) represent the nineteen bits of the inputs to decoders 14 to 16 from left to right in FIG. 3; and z(1) to z(16) represent the sixteen bits of the MTR decoder output, again from left to right.

| Encoder Logic: | |
|---|---|
| m11 = | x(2) \| x(3) |
| m21 = | x(5) \| x(6) |
| m31 = | x(1) & x(2) |
| m41 = | x(2) & x(3) |
| m51 = | x(5) & x(6) |
| m61 = | x(4) & m51 |
| m71 = | x(1) \| m11 |
| m81 = | x(1) \| x(4) |
| p1 = | ~m31 & ~m61 & (m81 \| ((m11 \| x(5)) & ~(m41 & m51))) |
| q1 = | m31 & (~x(4) \| (x(3) & x(5))) |
| r1 = | ~m31 & m61 |
| s1 = | ~p1 & ~m81 |
| t1 = | ~q1 & m31 |
| a1 = | ~p1 & m51 |
| b1 = | (m31 & m51) \| (m41 & m61) |
| c1 = | (~(x(4) \| m21)) \| ((r1 & ~m71) \| (t1 & ~m21) |
| k1 = | x(6) & (~r1 \| x(3)) |
| m12 = | x(8) \| x(9) |
| m22 = | x(11) \| x(12) |
| m32 = | x(7) & x(8) |
| m42 = | x(8) & x(9) |
| m52 = | x(11) & x(12) |
| m62 = | x(10) & m52 |
| m72 = | x(7) \| m12 |
| m82 = | x(7) \| x(10) |
| m92 = | x(10) & x(11) & ~x(12) |
| u12 = | k1 & x(7) & ~x(8) & x(9) & m92 |
| u22 = | ~k1 & ~m72 & m92 |
| p2 = | ~m32 & ~m62 & (m82 \| ((m12 \| m22) & ~(m42 & m52))) |
| q2 = | m32 & (~x(10) \| (x(9) & ~x(11))) |
| r2 = | ~m32 & m62 |
| s2 = | ~p2 & ~m82 |
| t2 = | ~q2 & m32 |
| a2 = | (p2 & m52) \| u12 |
| b2 = | (m32 & m52) \| (m42 & m62) |
| c2 = | (p2 & ~(x(10) \| x(11) \| x(12))) |
| d2 = | ((p2 \| q2) & x(7) & ~x(9)) \| (s2 & x(9)) |
| e2 = | (p2 & x(7) & x(9) & ~u12) \| (t2 & ~x(9)) |
| f2 = | (p2 & ~m72 & ~m92) \| (q2 & x(9)) |
| m13 = | x(13) & x(14) |
| m23 = | x(15) & x(16) |
| m33 = | x(13) \| x(14) |
| m43 = | x(15) \| x(16) |
| m53 = | m33 \| m43 |
| p3 = | ~m13 & ~m23 & m53 |
| q3 = | m13 & ~m23 |
| r3 = | ~m13 & m23 |
| s3 = | (m13 & m23) \| ~m53 |
| d3 = | p3 & x(13) |
| e3 = | r3 |
| f3 = | (p3 & ~m33) |
| ff3 = | q3 & x(15) |
| v1 = | (a1 \| b1) & d2 |
| v2 = | a1 & e2 |
| v3 = | b1 & e2 |
| v4 = | c1 & f2 |
| v5 = | (a2 \| b2) & d3 |
| v6 = | (a2 \| b2) & e3 |
| v7 = | a2 & ff3 |
| v8 = | c2 & f3 |
| v9 = | v2 \| v3 |
| v10 = | v1 \| v9 |
| v11 = | v4 \| v10 |
| v12 = | v7 \| v8 |
| v13 = | v6 \| v7 |
| v14 = | v5 \| v6 \| v12 |
| g1 = | p1 \| q1 |
| h1 = | t1 \| g1 |
| g2 = | p2 \| q2 |
| h2 = | t2 \| g2 |
| g3 = | p3 \| q3 |
| y(1) = | (x(1) & p1) \| (~x(3) & (q1 \| t1)) \| (x(3) & s1) |
| y(2) = | (x(2) & p1) \| r1 |
| y(3) = | (x(3) & p1) \| (~x(3) & s1) \| t1 |
| y(4) = | ~p1 & ~v3 |
| y(5) = | (x(4) & g1) \| (x(1) & r1) \| (x(3) & s1) \| v9 |
| y(6) = | ((x(5) & h1) \| (x(2) & r1)) & ~v2 |
| y(7) = | ((x(6) & h1) \| (x(3) & r1) \| (x(6) & s1)) & ~v10 |
| y(8) = | (((x(7)&p2) \| (~x(9)&(q2)\|t2)) \| (x(9)&s2) \| u22) & ~u12) \| v11 |
| y(9) = | (x(8) & p2) \| r2 \| u12 \| v11 |
| y(10) = | ((x(9) & p2) \| (~x(9) & s2) \| t2) & ~v11 |
| y(11) = | ~p2 \| u22 |
| y(12) = | (((x(10)&g2) \| (x(7)&r2) \| (x(9)&s2))& ~u12) \| v12 |
| y(13) = | ((((x(11) & h2) \| (x(8) & r2)) & ~u22) & ~v13) \| v8 |
| y(14) = | ((x(12) & h2) \| (x(9) & (r2 \| s2)) \| u12) & ~v14 |
| y(15) = | (x(13) & p3) \| r3 \| v12 |
| y(16) = | (x(14) & p3) \| s3 \| v14 |
| y(17) = | ~p3 & ~v14 |
| y(18) = | (x(15) & g3) \| (x(13) & r3) |
| y(19) = | (x(16) & g3) \| (x(14) & r3) \| (x(13) & s3) |

| Decoder Logic: | |
|---|---|
| m14 = | ~(y(6) \| y(7)) |
| m24 = | y(6) & ~y(7) |
| a4 = | y(5) & m14 |
| b4 = | y(5) & m24 |
| c4 = | ~y(5) & m14 |
| d4 = | ~y(5) & m24 |
| m15 = | ~(y(13) \| y(14)) |
| m25 = | y(13) & ~y(14) |
| a5 = | y(12) & m15 |
| b5 = | y(12) & m25 |
| c5 = | ~y(12) & m15 |
| d5 = | ~y(12) & m25 |
| e5 = | y(8) & y(9) |
| e6 = | y(15) & y(16) |
| v1 = | a4 & e5 |
| v2 = | b4 & e5 |
| v3 = | c4 & e5 |
| v4 = | d4 & e5 |
| v5 = | a5 & e6 |
| v6 = | b5 & e6 |
| v7 = | c5 & e6 |
| v8 = | d5 & e6 |
| v9 = | v1 \| v2 |
| v10 = | v5 \| v6 |
| v11 = | v5 \| v7 |
| yy(1) = | y(1) |

-continued

| | |
|---|---|
| yy(2) = | y(2) |
| yy(3) = | y(3) |
| yy(4) = | y(4) \| v2 |
| yy(5) = | y(5) & ~v9 |
| yy(6) = | y(6) \| v1 |
| yy(7) = | y(7) \| v9 \| v4 |
| yy(8) = | y(8) & ~v3 |
| yy(9) = | y(9) & ~(v9 \| v3 \| v4) |
| yy(10) = | y(10) \| v9 |
| yy(11) = | y(11) |
| yy(12) = | y(12) & ~v10 |
| yy(13) = | (y(13) \| v11) & ~v6 |
| yy(14) = | y(14) \| v11 \| v8 |
| yy(15) = | y(15) & ~v10 |
| yy(16) = | y(16) & ~(v10 \| v7 \| v8) |
| yy(17) = | y(17) \| v11 |
| yy(18) = | y(18) |
| yy(19) = | y(19) |
| m34 = | yy(1) \| yy(6) |
| p4 = | ~yy(4) |
| q4 = | yy(4) & ~(yy(2) \| yy(3)) & (~yy(1) \| (yy(1) & ~yy(5))) |
| r4 = | yy(4) & yy(2) |
| s4 = | yy(4) & ((~m34 & yy(3)) \| (yy(1) & yy(5))) |
| t4 = | yy(4) & yy(3) & m34 |
| m35 = | yy(8) \| yy(13) |
| p5 = | ~yy(11) |
| q5 = | yy(11) & ~(yy(9) \| yy(10)) & (~yy(8) \| (yy(8) & ~yy(12))) |
| r5 = | yy(11) & yy(9) |
| s5 = | yy(11) & ((~m35 & yy(10)) \| (yy(8) & yy(12))) |
| t5 = | yy(11) & yy(10) & m35 |
| u15 = | ~yy(8) & yy(9) & yy(10)&~yy(11)&~yy(12)&yy(13) & yy(14) |
| u25 = | yy(8) & ~yy(9) & ~yy(10)&yy(11)& yy(12)&~yy(13) &~yy(14) |
| m16 = | ~yy(16) & yy(17) |
| m26 = | yy(16) & yy(17) |
| p6 = | ~yy(17) |
| q6 = | ~yy(15) & m16 |
| r6 = | yy(15) & m16 |
| s6 = | m26 |
| g4 = | q4 \| t4 |
| g5 = | q5 \| t5 |
| h4 = | p4 \| g4 |
| h5 = | p5 \| g5 |
| i4 = | s4 & yy(1) |
| i5 = | s5 & yy(8) |
| g6 = | (s6 & yy(19)) |
| h6 = | q6 \| p6 |
| i6 = | q6 \| g6 |
| z(1) = | (yy(1) & p4) \| g4 \| (yy(5) & r4) |
| z(2) = | (yy(2) & p4) \| g4 \| (yy(6) & r4) \| i4 |
| z(3) = | (yy(3) & p4) \| (~yy(1) & g4 \| (yy(7) & r4) \| i4 |
| z(4) = | (yy(5) & (p4 \| q4)) \| r4 \| t4 |
| z(5) = | (yy(6) & h4) \| r4 \| i4 |
| z(6) = | (yy(7) & h4) \| r4 \| (s4 & yy(7)) |
| z(7) = | (yy(8) & p5) \| g5 \| (yy(12) & r5) \| u15 |
| z(8) = | ((yy(9) & p5) \| g5 \| (yy(13) & r5) \| i5) & ~u15 & ~u25 |
| z(9) = | ((yy(10) & p5) \| (~yy(8) & g5) \| (yy(14) & r5) \| i5) & ~u25 |
| z(10) = | (yy(12) & (p5 \| q5)) \| r5 \| t5 \| u15 \| u25 |
| z(11) = | (yy(13) & h5) \| r5 \| i5 |
| z(12) = | ((yy(14) & h5) \| r5 \| i5) & ~u15 & ~u25 |
| z(13) = | (yy(15) & p6) \| (yy(18) & r6) \| i6 |
| z(14) = | (yy(16) & p6) \| (yy(19) & r6) \| i6 |
| z(15) = | (yy(18) & h6) \| r6 \| g6 |
| z(16) = | (yy(19) & h6) \| r6 \| g6 |

A highly efficient boolean implementation for encoder 20 and decoder 30 of the rate 16/17 MTR(3/4(2), 14/22) code discussed above can be implemented with a total of 713 binary-input logic gates. The operations ~, & and | stand for the boolean operations NOT, AND and OR, respectively. In the encoder logic, x(1) to x(16) represent the sixteen bits supplied to the sixteen bit-lines of MTR encoder input 22, 21*a*, 23 from left to right in FIG. 5; a1 to a17 represent the seventeen bits of output 25*b* of the first substitution unit from left to right in the figure; and y(1) to y(17) represent the seventeen bits of MTR encoder output 28*b*, again from left to right. In the decoder logic, y(1) to y(17) represent the seventeen bits of the input word from left to right in FIG. 6; d1 to d17 represent the seventeen bits of the output 31*b* of the third inverse substitution unit from left to right; e1 to e17 represent the seventeen bits of the input to the first inverse substitution unit 34 from left to right; f1 to f17 represent the seventeen bits of the output of the first inverse substitution unit 34 from left to right; and z(1) to z(16) represent the sixteen bits of the MTR decoder output, again from left to right.

| Encoder Logic: | | |
|---|---|---|
| m01 | = | x(5) & x(6) |
| m11 | = | x(11) & x(12) |
| m21 | = | m01 & m11 |
| m31 | = | x(7) & x(8) |
| m41 | = | x(9) & x(10) |
| m51 | = | x(8) & x(9) & (x(7) \| x(10)) |
| m51 | = | m21 & m31 |
| m71 | = | m21 & ~m31 |
| m81 | = | x(2) & x(3) |
| m91 | = | x(14) & x(15) |
| p1 | = | ~m01 & ~m11 |
| p2 | = | m11 & ~x(6) & m51 |
| p3 | = | m11 & ~x(5) & x(6) & (m51 \| m31) |
| p4 | = | m11 & ~m01 & ~p2 & ~p3 |
| p5 | = | m01 & ~x(11) & m51 |
| p6 | = | m01 & ~x(12) & x(11) & (m51 \| m41) |
| p7 | = | m01 & ~m11 & ~p5 & ~p6 |
| p8 | = | m71 & ~m41 |
| p9 | = | m71 & m41 |
| p10 | = | m61 & ~m41 |
| p11 | = | m61 & m41 |
| p12 | = | p11 & x(4) |
| p13 | = | p11 & ~x(4) |
| m12 | = | p1 \| p4 |
| m22 | = | p2 \| p3 |
| m32 | = | p2 \| p5 |
| m42 | = | p3 \| p7 |
| m52 | = | m12 \| p8 |
| m62 | = | m52 \| p6 |
| m72 | = | p9 \| p10 |
| m82 | = | ~p11 \| p13 |
| m92 | = | ~p11 \| p12 |
| a1 | = | m82 & x(1) |
| a2 | = | (m82 & x(2)) \| p12 |
| a3 | = | (m82 & x(3)) \| p12 |
| a4 | = | (~p11 & x(4)) \| (p13 & x(13)) |
| a5 | = | (m12 & x(5)) \| m22 \| p7 & x(12)) \| (p9 & x(7)) \| (p10 & x(10)) \| p12 \| (p13 & x(14) & ~(x(15) & x(16))) |
| a6 | = | m12 & x(6)) \| (p7 & x(11)) \| p8) \| (p9 & x(8)) \| (p10 & x(9)) \| p12 \| (p13 & x(15) & ~x(14)) |
| a7 | = | (m62 & x(7)) \| (m32 & ~x(7)) \| (m42 & x(10)) \| (p13 & m91) |
| a8 | = | (m62 & x(8)) \| (m32 & ~x(10)) \| (m42 & x(9)) \| m72 \| p12 \| (p13 & x(16) & ~m91) |
| a9 | = | ~p1 |
| a10 | = | (m52 & x(9)) \| (p2 & x(5)) \| (p7 & x(8)) \| (p5 & x(12)) \| m72(p12 & x(1) & ~m81) \| p13 |
| a11 | = | (m52 & x(10)) \| (p2 & ~x(5)) \| (p3 & ~x(7)) \| (p7 & x(7)) \| (p5 & ~x(12)) \| (p6 & ~x(10)) \| m72 \| (p12 & m81) |
| a12 | = | (p1 & x(11)) \| m22 \| p5 \| p6 \| p8 \| (p12 & x(2) & ~x(3)) \| p13 |
| a13 | = | (p1 & x(12)) \| p4 \| p9 \| (p12 & x(3) & ~(x(1) & x(2))) \| p13 |
| a14 | = | m92 & x(13) |
| a15 | = | (m92 & x(14)) \| p13 |
| a16 | = | (m92 & x(15)) \| p13 |
| a17 | = | m92 & x(16) |
| m03 | = | a2 & a3 |
| m13 | = | m03 & a1 |
| m23 | = | m03 & a4 |
| m33 | = | m13 & a4 |
| m43 | = | a16 & a15 |
| m53 | = | m43 & a17 |
| m63 | = | m43 & a14 |
| m73 | = | m53 & a14 |
| m83 | = | a6 & a7 |

-continued

```
m93   = a11 & a12
v1    = m33 & a5
v2    = m33 & ~a5 & ~m83
v3    = m33 & ~a5 & m83
v4    = m13 & ~a4
v5    = ~a1 & m23 & a5
v6    = (a2 | a3 | a4 | a5 | a6 | a7 | a8)
v7    = (a16 | a15 | a14 | a13 | a12 | a11 | a10)
v8    = ~(a1 | v6)
v9    = m73 & a13
v10   = m73 & ~a13 & ~m93
v11   = m73 & ~a13 & m93
v12   = m53 & ~a14
v13   = ~a17 & m63 & a13
v14   = (a17 | v7)
v15   = (v3 | v5 | v8)
v16   = ~(v1 | v2 | v15 | v4)
v17   = (v11 | v13 | v14)
v18   = ~(v9 | v10 | v17 | v12)
v19   = a1 & ~v6 & ~a9 & ~v7 & a17
v20   = ~v16 | v19
b1    = (v16 & a1) | v1 | (v2 & a6) | (v3 & a8) | (v4 & a5) |
        (v5 & a7)
b2    = (v16 & a2) | v1 | (v2 & a7) | (v4 & a6) | (v5 & a8) |
        v8 | v19
b3    = (v16 & a3) | v3 | (v4 & a7) | v8
b4    = (v16 & a4) | (v1 & a7) | v2 | v19
b5    = (v16 & a5) | v20
b6    = (v16 & a6) | v20
b7    = (v16 & a7) | v15
b8    = (~v15 & a8) | v19
b9    = a9 | v19
b10   = (~v17 & a10) | v19
b11   = (v18 & a11) | v17
b12   = (v18 & a12) | ~v18
b13   = (v18 & a13) | ~v18
b14   = (v18 & a14) | (v9 & a11) | v10
b15   = (v18 & a15) | v11 | (v12 & a11) | v14
b16   = (v18 & a16) | v9 | (v10 & a11) | (v12 & a12) |
        (v13 & a10) | v14
b17   = (v18 & a17) | v9 | (v10 & a12) | (v11 & a10) |
        (v12 & a13) | (v13 & a11)
v21   = b6 & ~b7 & ~b8 & b9 & b10 & ~b11 & ~b12
v22   = ~b6 & b7 & b8 & ~b9 & ~b10 & ~b11 & b12
v23   = ~b6 & b7 & b8 & ~b9 & ~b10 & b11 & b12
v24   = b6 & b7 & ~b8 & ~b9 & b10 & b11 & ~b12
v25   = b1 & b2 & ~b3 & ~b4 & b5 & v21
v26   = b1 & ~b2 & ~b3 & b4 & b5 & v22
v27   = ~b1 & ~b2 & b3 & b4 & ~b5 & v23
v28   = ~b1 & b2 & b3 & ~b4 & ~b5 & v24
v29   = b17 & b16 & ~b15 & ~b14 & b13 & v22 & ~v26
v30   = b17 & ~b16 & ~b15 & b14 & b13 & v21 & ~v25
v31   = ~b17 & ~b16 & b15 & b14 & b13 & v24 & ~v28
v32   = ~b17 & b16 & b15 & ~b14 & ~b13 & v23 & ~v27
v33   = v25 | v26 | v27 | v28
v34   = v29 | v30 | v31 | v32
y(1)  = b1 | v33
y(2)  = b2 & ~v33
y(3)  = b3 | v33
y(4)  = b4 & ~v33
y(5)  = b5 | v33
y(6)  = (b6 | v33) & ~v31
y(7)  = b7 | v33
y(8)  = b8 & ~v33
y(9)  = b9 | v33 | v34
y(10) = b10 & ~v34
y(11) = b11 | v34
y(12) = (b12 | v34) & ~v27
y(13) = b13 | v34
y(14) = b14 & ~v34
y(15) = b15 | v34
y(16) = b16 & ~v34
y(17) = b17 | v34
```

Decoder Logic:

```
m04   = y(5) & y(6)
m14   = m04 & y(7) & y(9)
m24   = y(1) & y(2)
m34   = y(1) & y(3) & m14
u01   = m34 & ~y(10) & ~y(11) & y(12)
u11   = m34 & ~y(10) & y(11) & ~y(12)
u21   = m34 & y(10) & ~y(11) & ~y(12)
u31   = m34 & y(10) & y(11) & ~y(12)
u41   = m24 & y(4) & m04 & y(8) & y(9) & y(10)
u51   = u11 | u31
u61   = u01 | u11
u71   = u01 | u21
u81   = u71 | u41
u91   = u51 | u71
m44   = y(9) & y(11) & y(12) & y(13)
m54   = y(17) & y(15) & m44
m64   = m54 & ~u91
u02   = m64 & ~y(8) & ~y(7) & y(6)
u12   = m64 & ~y(8) & y(7) & ~y(6)
u22   = m64 & y(8) & ~y(7) & ~y(6)
u32   = m64 & y(8) & y(7) & ~y(6)
u42   = u12 | u32
u52   = u02 | u12
u62   = u02 | u22
d1    = y(1) & ~u51
d2    = (y(2) | u21 | u31) & ~u41
d3    = y(3) & ~u81
d4    = (y(4) | u61) & ~u41
d5    = y(5) & ~u51 & ~u41
d6    = (y(6) | u12) & ~u61 & ~u41
d7    = y(7) & ~u81
d8    = (y(8) | u61) & ~u41
d9    = y(9) & ~u51 & ~u41 & ~u42
d10   = y(10) | u52) & ~u41
d11   = y(11) & ~u62
d12   = (y(12) | u11) & ~u52
d13   = y(13) & ~u42
d14   = y(14) | u52
d15   = y(15) & ~u62
d16   = y(16) | u22 | u32
d17   = y(17) & ~u42
m05   = d1 & d2
m15   = d5 & d6
m25   = ~(d1 & d2)
m35   = m15 & d7
m45   = m15 & ~d7
m55   = d17 & d16
m65   = d13 & d12
m75   = ~(d17 & d16)
m85   = m65 & d11
m95   = m65 & ~d11
u03   = m05 & m45
u13   = m25 & d4 & m15
u23   = ~d2 & d3 & m35
u33   = m25 & ~d4 & m45 & ~(~d1 & d2 & d3 & d8 & d9)
u43   = ~d3 & m35
u53   = d2 & d3 & m35
u63   = u13 | u23
u73   = u03 | u43
u83   = u63 | u33
u93   = u83 | u73 | u53
u04   = m55 & m95
u14   = m75 & d14 & m65
u24   = ~d16 & d15 & m85
u34   = m75 & ~d14 & m95 & ~(~d17 & d16 & d15 & d10 & d9)
u44   = ~d15 & m85
u54   = d16 & d15 & m85
u64   = u14 | u24
u74   = u04 | u44
u84   = u64 | u34
u94   = u84 | u74 | u54
e1    = (d1 & ~u93) | u83 | u03
e2    = (d2 & ~u93) & ~u53
e3    = (d3 & u93) & ~u53
e4    = (d4 & ~u93) | u63 | u73
e5    = (d5 & ~u93) | u73 | (u33 & d1)
e6    = (d6 & ~u93) | u23 | (u13 & d1) | (u33 & d2)
e7    = (d7 & ~u93) | (u03 & d4) | (u13 & d2) | u23 |
        (u33 & d3) | (u43 & d1)
e8    = (d8 & ~u23 & ~u43) | (u23 & d1) | (u43 & d2)
e9    = d9
e10   = (d10 & ~u24 & ~u44) | (u24 & d17) | (u44 & d16)
e11   = (d11 & ~u94) | (u04 & d14) | (u14 & d16) | u24 |
```

-continued

|  |  |  |
|---|---|---|
|  |  | (u34 & d15) \| (u44 & d17) |
| e12 | = | (d12 & ~u94) \| u24 \| (u14 & d17) \| (u34 & d16) |
| e13 | = | (d13 & ~u94) \| u74 \| (u34 & d17) |
| e14 | = | (d14 & ~u94) \| u64 \| u74 |
| e15 | = | (d15 \| u94) & ~u54 |
| e16 | = | (d16 \| u94) & ~u54 |
| e17 | = | (d17 & ~u94) \| u84 \| u04 |
| m06 | = | ~e10 & e11 & ~e13 |
| m16 | = | ~e8 & e7 & ~e5 |
| u05 | = | e2 & e3 & e5 & e6 & e8 & e9 |
| u15 | = | e16 & e15 & e13 & e12 & e10 & e9 |
| u25 | = | u05 \| u15 |
| f1 | = | (e1 & ~u05) \| (u05 & (e10 \| m06)) |
| f2 | = | (e2 & ~u05) \| (u05 & (e11 \| e12)) |
| f3 | = | (e3 & ~u05) \| (u05 & (e13 \| m06)) |
| f4 | = | (e4 \| u05) & ~u15 |
| f5 | = | e5 \| u25 |
| f6 | = | e6 \| u25 |
| f7 | = | e7 \| u25 |
| f8 | = | e8 \| u25 |
| f9 | = | e9 & ~u25 |
| f10 | = | e10 \| u25 |
| f11 | = | e11 \| u25 |
| f12 | = | e12 \| u25 |
| f13 | = | e13 \| u25 |
| f14 | = | (e14 & ~u15) \| (u15 & e4) |
| f15 | = | (e15 & ~u15) \| (u15 & (e5 \| m16)) |
| f16 | = | (e16 & ~u15) \| (u15 & (e7 \| e6)) |
| f17 | = | (e17 & ~u15) \| (u15 & (e8 \| m16)) |
| m07 | = | f11 & f10 & f8 & ~f7 |
| m17 | = | f9 & f13 |
| m27 | = | f9 & ~f13 |
| m37 | = | f9 & f12 |
| m47 | = | (f11 \| f10) & ~f6 & ~(f7 & f8) |
| m57 | = | m37 & ~f5 |
| m67 | = | m37 & f5 |
| q1 | = | m17 & m07 |
| q2 | = | m27 & m07 |
| q3 | = | m37 & f6 |
| q4 | = | m17 & ~q1 |
| q5 | = | m27 & ~f12 & ~q2 |
| q6 | = | m57 & m47 |
| q7 | = | m67 & m47 |
| q8 | = | m57 & ~f6 & ~q6 |
| q9 | = | m67 & ~q7 |
| q10 | = | q1 \| q2 \| q3 |
| q11 | = | q10 \| q4 \| q7 \| q9 |
| q12 | = | q5 \| q6 \| q8 \| q10 |
| q13 | = | q5 \| q9 |
| q14 | = | q6 \| q7 |
| q15 | = | ~f9 \| q4 |
| q16 | = | ~f9 \| q3 \| q4 |
| q17 | = | q16 \| q8 |
| z(1) | = | f1 |
| z(2) | = | f2 |
| z(3) | = | f3 |
| z(4) | = | f4 |
| z(5) | = | (q15 & f5) \| q12 \| (q7 & f10) |
| z(6) | = | (q15 & f6) \| q12 \| q9 |
| z(7) | = | (q17 & f7) \| (q1 & f5) \| q2 \| (q5 & f11) \| (q14 & ~f7) \| (q9 & ~f11) |
| z(8) | = | (q17 & f8) \| (q1 & f6) \| q2 \| (q5 & f10) \| q14 \| q9 |
| z(9) | = | (q16 & f10) \| q1 \| (q2 & f6) \| (q13 & f8) \| q14 \| q8 |
| z(10) | ) = | (q16 & f11) \| q1 \| (q2 & f5) \| (q13 & f7) \| (q14 & ~f8) \| (q8 & ~f11) |
| z(11) | = | (~f9 & f12) \| q11 \| (q5 & f6) \| q8 |
| z(12) | = | (~f9 & f13) \| q11 \| (q5 & f5) \| (q6 & f10) |
| z(13) | = | f14 |
| z(14) | = | f15 |
| z(15) | = | f16 |
| z(16) | = | f17 |

While preferred embodiments of the invention have been described in detail above, it will be appreciated that many changes and modifications can be made to the embodiments described without departing from the scope of the invention.

While the invention has been particularly shown and described with reference to a preferred embodiment, it will be understood by those skilled in the art that various changes in form and detail may be made therein without departing from the spirit and scope of the invention.

What is claimed is:

1. A method for encoding to a magnetic recording channel, a plurality of successive m-bit binary data words to produce a plurality of successive n-bit binary code words, where n and m are preselected positive integers such that n is greater than m, said method comprising:

partitioning each of said plurality of successive m-bit binary data words into a plurality of blocks of bits;

encoding at least one of said blocks of bits in accordance with a finite-state coding scheme to produce said lo plurality of successive n-bit binary code words; and transforming each of said plurality of successive n-bit binary code words by at least one stage of violation correction, wherein said at least one stage of violation correction includes detecting the occurrence of any of a plurality of prohibited bit patterns at one or more predetermined locations within each of said plurality of successive n-bit binary code words and replacing any said prohibited bit pattern so detected by a corresponding substitute bit pattern;

wherein said finite-state coding scheme, said prohibited bit patterns, and said substitute bit patterns are predetermined such that the maximum number of consecutive bits of a first value, in said plurality of successive n-bit binary code words, is limited to a first predetermined number j, where j is a positive integer which is greater or equal to 2, and the maximum number of consecutive bits of a second value is limited to a second predetermined number k.

2. A method according to claim 1 wherein m=16 and n=19, and wherein each said plurality of blocks of bits includes a first block of six bits, a second block of six bits and a third blocks of four bits and wherein said step of encoding at least one of said blocks of bits includes encoding a first block of bits in accordance with a rate 6/7 block code to produce a first subcode word, encoding a second block of bits in accordance with a rate 6/7 two-state code to produce a second subcode word, wherein the last bit of said first subcode word determines the state for said two-state code, and encoding a third block of bits in accordance with a rate 4/5 block code to produce a third subcode word, thereby producing said plurality of successive 19-bit binary code words; and wherein said bit patterns at one or more predetermined locations within each said plurality of successive n-bit binary code words include a first plurality of prohibited bit patterns at a first location, which are across a boundary between said first and second subcode words, and a second plurality of prohibited bit patterns at a second location, which are across a boundary between said second and third subcode words.

3. A method according to claim 2 wherein, said first subcode word is selected from a set of sixty-four subcode words comprising fifty-four 7-bit subcode words that are generated from a Shannon cover for j=2 by making seven transitions starting from state two of said Shannon cover and ending in states one or two thereof and discarding the words represented in hexadecimal format by 00, 01 and 4C, and further comprising ten 7-bit subcode words which are represented in hexadecimal format by 03, 0B, 13, 23, 43, 1B, 2B, 4B, 53 and 5B;

wherein said second subcode word is selected from a set of sixty-six subcode words comprising fifty-five 7-bit words that are generated from a Shannon cover for j=2 by making seven transitions starting from state two of said Shannon cover and ending in states one or two thereof and discarding the words represented in hexadecimal format by 00 and 19, and further comprising eleven 7-bit words which are represented in hexadecimal format by 03, 0B, 13, 23, 43, 1B, 2B, 4B, 33, 53 and 5B, wherein for a first predetermined value of said second block said second subcode word is selected as 56 or 33 in dependence on whether said last bit of said first subcode word is 0 or 1 respectively, and for a second predetermined value of said second block said second subcode word is selected as 4C or 06 in depending on whether said last bit of said first subcode word is 0 or 1 respectively; and wherein said third subcode word is selected from a set of sixteen 5-bit subcode words which are represented in hexadecimal format by 01, 02, 04, 05, 06, 08, 09, 0A, 0C, 0D, 10, 11, 12, 14, 15 and 16.

4. A method according to claim 2 wherein said prohibited bit patterns and said substitute bit patterns are further predetermined such that for any consecutive group of bits in a serial bit steam comprised of said plurality of successive n-bit binary code words, a third predetermined number q determines the maximum number of consecutive four-bit periods wherein the sequence of two consecutive bits of said first value is followed by two consecutive bits of said second value.

5. A method according to claim 1 wherein m=16 and n=17, and wherein said plurality of blocks of bits includes a first block of four bits, a second block of eight bits, and third blocks of four bits, wherein said encoding of at least one block of bits to produce said plurality of successive 17 bit binary code words, includes encoding each said second block of eight bits in accordance with a rate 8/9 block code, and wherein said transforming of said 17-bit binary code word by at least one stage of violation correction, includes a first, second, and third stage of violation correction;

wherein said step of detecting the accuracy of any of a plurality of prohibits bit patterns comprises the step of detecting the occurrence of any of a first plurality of prohibited 17-bit patterns in said 17-bit binary code word and replacing said prohibited bit pattern so detected by a corresponding said substitute bit pattern, and then partitioning said 17-bit sequence into a fourth block of one bit, a fifth block of eight bits, and a sixth blocks of eight bits;

wherein said second stage of violation correction includes the step of detecting the occurrence of any of a second plurality of prohibited 8-bit patterns in said fifth block of eight bits, and any of a third plurality of prohibited 8-bit patterns in said sixth block of eight bits, and replacing any prohibited bit pattern so detected by a corresponding said substitute bit pattern; and wherein said third stage of violation correction comprises the step of detecting the occurrence of any of a fourth plurality of prohibited 17-bit patterns in said 17-bit binary code word resulting from said second stage of violation correction and replacing any prohibited bit pattern so detected by a corresponding said substitute bit pattern.

6. A method according to claim 5, wherein said step of encoding said second block of eight bits in accordance with a rate 8/9 block code includes the step of selecting for each second block of eight bits a 9-bit code selected from a set of 256 9-bit codes comprising 249 9-bit codes that are generated from a Shannon cover for j=3 by making nine transitions starting from state three of said Shannon cover and ending in states one or two thereof, and further comprising seven 9-bit codes which are represented in hexadecimal format by 03C, 0BC, 13C, 03D, 0BD, 13D and 1EF.

7. A method according to claim 5, wherein said prohibited bit patterns and said substitute bit patterns are predetermined such that for any consecutive group of bits in a serial bit steam comprised of said plurality of successive n-bit binary code words, a third predetermined number q determines the maximum number of consecutive four-bit periods wherein the sequence of two consecutive bits of said first value is followed by two consecutive bits of said second value.

8. A method according to claim 1 further comprising the steps of:

coupling said plurality of successive n-bit binary code words to a magnetic recording channel wherein said plurality of successive n-bit binary code words are recorded on, and reproduced from, a magnetic recording medium; and decoding said plurality of successive n-bit binary code words reproduced from said recording medium to recover said plurality of successive of m-bit binary data words.

9. An apparatus for encoding to a magnetic recording channel, a plurality of successive of m-bit binary data words to produce a plurality of successive n-bit binary code words, where n and m are preselected positive integers such that n is greater than m, said apparatus comprising:

a first device adapted for partitioning each of said plurality of successive of m-bit binary data words into a plurality of blocks of bits;

a second device for encoding at least one of said plurality of blocks of bits in accordance with a finite-state coding scheme to produce said plurality of successive n-bit binary code words; and a third device for transforming said plurality of successive n-bit binary code words by at least one stage of violation correction, wherein said at least one stage of violation correction includes means for detecting the occurrence of any of a plurality of prohibited bit patterns at one or more predetermined locations in said n-bit binary code word and replacing any prohibited bit pattern so detected by a corresponding substitute bit pattern;

wherein said finite-state coding scheme, said prohibited bit patterns, and said substitute bit patterns are predetermined such that in said plurality of successive said n-bit code words, the maximum number of consecutive bits of a first value is limited to a first predetermined number j, where j is greater or equal to 2, and the maximum number of consecutive bits of a second value is limited to a second predetermined number k.

10. The Apparatus according to claim 9 wherein m=16 and n=19, wherein said plurality of block of bits includes a first block of six bits, a second block of six bits, and third blocks of four bits;

wherein said second device includes a first rate 6/7 block encoder for encoding said first block of six bits to produce a first subcode, a second rate 6/7 two-state encoder for encoding said second block of six bits to produce a second subcode, wherein the last bit of said first subcode word is supplied to an input of said second rate 6/7 two-state encoder to determine said state thereof, and a rate 4/5 block encoder for encoding said third block of four bits to produce a third subcode; and wherein said third device include means for detecting the occurrence of any of a first plurality of said prohibited bit patterns across the boundary between said first and second subcode;

wherein said third device includes means for detecting amp the occurrence of any of a second plurality of said prohibited bit patterns across the boundary between said second and third subcode; and wherein said third device includes means for replacing any said prohibited bit pattern so detected by a corresponding substitute bit pattern.

11. The apparatus according to claim 10, wherein said bits of said first value are 1 and said bits of a second value are 0.

12. The apparatus according to claim 11 wherein said first rate 6/7 block encoder is configured to select said first subcode from a set of sixty-four subcode options comprising fifty-four 7-bit codes that are generated from the Shannon cover for j=2 by making seven transitions starting from state two of said Shannon cover and ending in states one or two thereof and discarding the codes represented in hexadecimal format by 00, 01 and 4C, and further comprising ten 7-bit codes which are represented in hexadecimal format by 03, 0B, 13, 23, 43, 1B, 2B, 4B, 53 and 5B;

wherein said second rate 6/7 two-state encoder is configured to select said second subcode from a set of sixty-six subcode options comprising fifty-five 7-bit codes that are generated from the Shannon cover for j=2 by making seven transitions starting from state two of said Shannon cover and ending in states one or two thereof and discarding the codes represented in hexadecimal format by 00 and 19, and further comprising eleven 7-bit codes which are represented in hexadecimal format by 03, 0B, 13, 23, 43, 1B, 2B, 4B, 33, 53 and 5B, wherein for a first predetermined value of said second rate 6/7 two-state encoder is configured to select said second subcode as 56 or 33 in dependence on whether said last bit of said first subcode word is 0 or 1 respectively, and for a second predetermined value of said second block the second rate 6/7 two-state encoder is configured to select said second subcode as 4C or 06 in dependence on whether said last bit of said first subcode word is 0 or 1 respectively; and wherein said rate 4/5 block encoder is configured to select said third subcode from a set of sixteen 5-bit subcode options which are represented in hexadecimal format by 01, 02, 04, 05, 06, 08, 09, 0A, 0C, 0D, 10, 11, 12, 14, 15 and 16.

13. The apparatus according to claim 12, wherein, in said finite-state coding scheme, said prohibited bit patterns and said substitute bit patterns are further predetermined such that for any consecutive group of bits in a serial bit steam comprised of said plurality of successive n-bit binary code words, a third predetermined number q determines the maximum number of consecutive four-bit periods wherein the sequence of two consecutive bits of said first value is followed by two consecutive bits of said second value.

14. The apparatus according to claim 9, wherein m=16 and n=17, and wherein said plurality of blocks of bits includes a first block of four bits, a second block of eight bits, and a third blocks of four bits;

said second device includes a rate 8/9 block encoder for encoding said second block of eight;

said at least one stages of violation correction includes a first stage, a second stage, and a third stage of violation correction;

wherein said first stage of violation correction is adapted to detect the occurrence of any of a first plurality of 17 bit prohibited patterns in said sequence of said plurality of successive 17 bit binary code words and replacing any said prohibited bit pattern so detected by a corresponding substitute bit pattern, and then partitioning each of said plurality of successive 17 bit binary code words into a fourth block of eight bits, a fifth block of one bit, and sixth blocks of eight bits;

wherein said second stage of violation correction adapted to detect the occurrence of any of a second plurality of said prohibited 8-bit patterns in said fourth block, and any of a third plurality of prohibited bit patterns in said sixth block, and replacing any prohibited bit pattern so detected by a corresponding substitute bit pattern; and wherein said third stage adapted to detect the occurrence of any of a fourth plurality of prohibited 17-bit patterns in the 17-bit sequence resulting from said second stage and replacing any prohibited bit pattern so detected by a respective substitute bit pattern.

15. The apparatus according to claim 14 wherein said bits of said first value are 1 and bits of said second value are 0.

16. The apparatus according to claim 15 wherein said rate 8/9 block encoder is configured to select said subcode word from a set of 256 subcode words comprising 249 9-bit words that are generated from a Shannon cover for j=3 by making nine transitions starting from state three of said Shannon cover and ending in states one or two thereof, and further comprising seven 9-bit words which are represented in hexadecimal format by 03C, 0BC, 03D, 0BD, 13D and 1EF.

17. The apparatus according to claim 16, wherein,said finite-state coding scheme, said prohibited bit patterns, and said substitute bit patterns are further predetermined such that for any sequential group of bits of said plurality of successive 19-bit binary code words, a third predetermined number q, determines the maximum number of consecutive four-bit periods, wherein the sequence of two consecutive bits of said first value is follows by two consecutive bits of said second value.

18. A data storage system comprising:

encoder apparatus for encoding to a magnetic recording channel, a plurality of successive m-bit data words to produce a plurality of successive n-bit code words, where n and m are preselected positive integers such that n is greater than m, wherein said encoder apparatus includes a first device, a second device and a third device;

wherein said first device includes means for partitioning each of said plurality of successive of m-bit binary data words into a plurality of blocks of bits;

wherein said second device includes means for encoding at least one of said plurality of blocks of bits in accordance with a finite-state coding scheme to produce said plurality of successive n-bit binary code words; and wherein said third device includes means for transforming said plurality of successive n-bit binary code words by at least one stage of violation correction, wherein said at least one stage of violation correction includes detecting the occurrence of any of a plurality of pro hibited bit patterns at one or more predetermined locations in said n-bit binary code word and replacing any prohibited bit pattern so detected by a corresponding substitute bit pattern;

wherein said finite-state coding scheme, said prohibited bit patterns, and said substitute bit patterns are predetermined such that in said plurality of successive n-bit code words, the maximum number of consecutive bits of a first value is limited to a first predetermined number j, where j is greater or equal to 2, and the maximum number of consecutive bits of a second value is limited to a second predetermined number k;

a recording channel adapted to record said plurality of successive n-bit binary code words on a magnetic recording medium; and a decoder apparatus adapted to decode a sequence of said plurality of successive n-bit code words reproduced from said magnetic recording medium to recover said sequence of plurality of successive m-bit binary data words.

\* \* \* \* \*

UNITED STATES PATENT AND TRADEMARK OFFICE
CERTIFICATE OF CORRECTION

PATENT NO.    : 6,557,124 B1
DATED         : April 29, 2003
INVENTOR(S)   : Cideciyan et al.

It is certified that error appears in the above-identified patent and that said Letters Patent is hereby corrected as shown below:

<u>Title page,</u>
Item [57], ABSTRACT, delete "where b" and replace with -- where j --.

<u>Column 4,</u>
Line 14, delete "preceding" and replace with -- precoding --.

<u>Column 20,</u>
Line 16, delete "lo".

Signed and Sealed this

Fourteenth Day of October, 2003

JAMES E. ROGAN
*Director of the United States Patent and Trademark Office*